US008083953B2

(12) United States Patent
Millward et al.

(10) Patent No.: US 8,083,953 B2
(45) Date of Patent: Dec. 27, 2011

(54) REGISTERED STRUCTURE FORMATION VIA THE APPLICATION OF DIRECTED THERMAL ENERGY TO DIBLOCK COPOLYMER FILMS

(75) Inventors: Dan B. Millward, Boise, ID (US); Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 886 days.

(21) Appl. No.: 11/714,336

(22) Filed: Mar. 6, 2007

(65) Prior Publication Data

US 2008/0217292 A1 Sep. 11, 2008

(51) Int. Cl.
*B44C 1/22* (2006.01)
*H01L 21/302* (2006.01)
*B82B 3/00* (2006.01)

(52) U.S. Cl. .................. 216/2; 216/17; 216/39; 216/41; 216/49; 216/83; 216/55; 216/67; 216/99; 427/97.5; 430/313; 430/330; 438/700; 438/947; 977/888; 977/895; 977/900

(58) Field of Classification Search .................. None
See application file for complete search history.

(56) References Cited

U.S. PATENT DOCUMENTS

| 4,623,674 | A | 11/1986 | Bailey, Jr. |
| 4,877,647 | A | 10/1989 | Klabunde |
| 5,482,656 | A | 1/1996 | Hiraoka et al. |
| 5,538,655 | A | 7/1996 | Fauteux et al. |
| 5,622,668 | A | 4/1997 | Thomas |
| 5,904,824 | A | 5/1999 | Oh |
| 5,948,470 | A | 9/1999 | Harrison et al. |
| 6,111,323 | A | 8/2000 | Carter et al. |
| 6,143,647 | A | 11/2000 | Pan et al. |
| 6,368,871 | B1 | 4/2002 | Christel et al. |
| 6,403,382 | B1 | 6/2002 | Zhu et al. |
| 6,423,465 | B1 | 7/2002 | Hawker et al. |
| 6,503,841 | B1 | 1/2003 | Criscuolo |
| 6,506,660 | B2 | 1/2003 | Holmes et al. |
| 6,548,830 | B1 | 4/2003 | Noguchi et al. |
| 6,565,763 | B1 | 5/2003 | Asakawa |
| 6,566,248 | B1 | 5/2003 | Wang et al. |
| 6,569,528 | B2 | 5/2003 | Nam et al. |
| 6,689,473 | B2 | 2/2004 | Guire et al. |
| 6,699,797 | B1 | 3/2004 | Morris et al. |

(Continued)

FOREIGN PATENT DOCUMENTS

CN 1562730 1/2005

(Continued)

OTHER PUBLICATIONS

Cheng, Joy Y., et al., Nano Letters, vol. 6, No. 9, 2006, pp. 2099-2103, publ on web Aug. 16, 2006.

(Continued)

*Primary Examiner* — Anita K Alanko
(74) *Attorney, Agent, or Firm* — Whyte Hirschboeck Dudek SC

(57) ABSTRACT

Methods for fabricating sublithographic, nanoscale linear microchannel arrays over surfaces without defined features utilizing self-assembling block copolymers, and films and devices formed from these methods are provided. Embodiments of the methods use a multilayer induced ordering approach to align lamellar films to an underlying base film within trenches, and localized heating to anneal the lamellar-phase block copolymer film overlying the trenches and outwardly over the remaining surface.

37 Claims, 17 Drawing Sheets

U.S. PATENT DOCUMENTS

| | | |
|---|---|---|
| 6,713,238 B1 | 3/2004 | Chou et al. |
| 6,746,825 B2 | 6/2004 | Nealey et al. |
| 6,781,166 B2 | 8/2004 | Lieber et al. |
| 6,890,624 B1 | 5/2005 | Kambe et al. |
| 6,890,703 B2 | 5/2005 | Hawker et al. |
| 6,924,341 B2 | 8/2005 | Mays |
| 6,926,953 B2 | 8/2005 | Nealey et al. |
| 6,949,456 B2 | 9/2005 | Kumar |
| 6,962,823 B2 | 11/2005 | Empedocles et al. |
| 6,989,426 B2 | 1/2006 | Hu et al. |
| 6,992,115 B2 | 1/2006 | Hawker et al. |
| 7,030,495 B2 | 4/2006 | Colburn et al. |
| 7,037,744 B2 | 5/2006 | Colburn et al. |
| 7,045,851 B2 | 5/2006 | Black et al. |
| 7,056,455 B2 | 6/2006 | Matyjasewski et al. |
| 7,056,849 B2 | 6/2006 | Wan et al. |
| 7,115,995 B2 | 10/2006 | Wong |
| 7,118,784 B1 | 10/2006 | Xie |
| 7,132,370 B2 | 11/2006 | Paraschiv |
| 7,135,144 B2 | 11/2006 | Christel et al. |
| 7,135,388 B2 | 11/2006 | Ryu et al. |
| 7,135,523 B2 | 11/2006 | Ho et al. |
| 7,163,712 B2 | 1/2007 | Chilkoti et al. |
| 7,172,953 B2 | 2/2007 | Lieber et al. |
| 7,186,613 B2 | 3/2007 | Kirner |
| 7,189,430 B2 | 3/2007 | Ajayan et al. |
| 7,189,435 B2 | 3/2007 | Tuominen et al. |
| 7,190,049 B2 | 3/2007 | Tuominen et al. |
| 7,202,308 B2 | 4/2007 | Boussand et al. |
| 7,291,284 B2 | 11/2007 | Mirkin et al. |
| 7,347,953 B2 | 3/2008 | Black et al. |
| 7,407,887 B2 | 8/2008 | Guo |
| 7,408,186 B2 | 8/2008 | Merkulov et al. |
| 7,514,339 B2 | 4/2009 | Yang et al. |
| 7,521,090 B1 | 4/2009 | Cheng et al. |
| 7,553,760 B2 | 6/2009 | Yang et al. |
| 7,592,247 B2 | 9/2009 | Yang et al. |
| 7,605,081 B2 | 10/2009 | Yang et al. |
| 7,767,099 B2 | 8/2010 | Li et al. |
| 2003/0077452 A1 | 4/2003 | Guire et al. |
| 2003/0091752 A1* | 5/2003 | Nealey et al. ............... 427/558 |
| 2003/0100822 A1 | 5/2003 | Lew et al. |
| 2003/0178707 A1 | 9/2003 | Abbott |
| 2003/0185741 A1 | 10/2003 | Matyjaszewski |
| 2004/0084298 A1 | 5/2004 | Yao et al. |
| 2004/0124092 A1 | 7/2004 | Black et al. |
| 2004/0125266 A1 | 7/2004 | Miyauchi et al. |
| 2004/0127001 A1 | 7/2004 | Colburn |
| 2004/0142578 A1 | 7/2004 | Wiesner et al. |
| 2004/0192013 A1 | 9/2004 | Ryu et al. |
| 2004/0222415 A1 | 11/2004 | Chou et al. |
| 2004/0254317 A1 | 12/2004 | Hu et al. |
| 2004/0256615 A1 | 12/2004 | Sirringhaus et al. |
| 2004/0256662 A1 | 12/2004 | Black et al. |
| 2004/0265548 A1 | 12/2004 | Ho et al. |
| 2005/0062165 A1 | 3/2005 | Saenger et al. |
| 2005/0074706 A1 | 4/2005 | Bristol |
| 2005/0100830 A1 | 5/2005 | Xu et al. |
| 2005/0124135 A1 | 6/2005 | Ayazi et al. |
| 2005/0147841 A1 | 7/2005 | Tavkhelidze et al. |
| 2005/0167651 A1 | 8/2005 | Merkulov et al. |
| 2005/0208752 A1 | 9/2005 | Colburn et al. |
| 2005/0238889 A1 | 10/2005 | Iwamoto |
| 2005/0250053 A1 | 11/2005 | Marsh et al. |
| 2005/0271805 A1 | 12/2005 | Kambe et al. |
| 2005/0272341 A1 | 12/2005 | Colburn et al. |
| 2006/0013956 A1 | 1/2006 | Angelescu et al. |
| 2006/0014001 A1 | 1/2006 | Zhang et al. |
| 2006/0038182 A1 | 2/2006 | Rogers et al. |
| 2006/0046079 A1 | 3/2006 | Lee |
| 2006/0046480 A1 | 3/2006 | Guo |
| 2006/0060863 A1 | 3/2006 | Lu et al. |
| 2006/0062867 A1 | 3/2006 | Choi |
| 2006/0078681 A1 | 4/2006 | Hieda et al. |
| 2006/0105562 A1 | 5/2006 | Yi |
| 2006/0124467 A1 | 6/2006 | Ho et al. |
| 2006/0134556 A1 | 6/2006 | Nealey et al. |
| 2006/0163646 A1 | 7/2006 | Black |
| 2006/0192283 A1 | 8/2006 | Benson |
| 2006/0205875 A1 | 9/2006 | Cha et al. |
| 2006/0217285 A1 | 9/2006 | Destarac |
| 2006/0231525 A1 | 10/2006 | Asakawa et al. |
| 2006/0249784 A1 | 11/2006 | Black et al. |
| 2006/0249796 A1 | 11/2006 | Tavkhelidze et al. |
| 2006/0258159 A1 | 11/2006 | Colburn et al. |
| 2006/0278158 A1 | 12/2006 | Tolbert et al. |
| 2006/0281266 A1 | 12/2006 | Wells |
| 2007/0020749 A1 | 1/2007 | Nealey et al. |
| 2007/0023805 A1 | 2/2007 | Wells |
| 2007/0045562 A1 | 3/2007 | Parekh |
| 2007/0071881 A1 | 3/2007 | Chua et al. |
| 2007/0072403 A1 | 3/2007 | Sakata |
| 2007/0122932 A1 | 5/2007 | Kodas et al. |
| 2007/0161237 A1 | 7/2007 | Lieber et al. |
| 2007/0175859 A1 | 8/2007 | Black et al. |
| 2007/0181870 A1 | 8/2007 | Libertino et al. |
| 2007/0200477 A1 | 8/2007 | Tuominen et al. |
| 2007/0208159 A1 | 9/2007 | McCloskey et al. |
| 2007/0218202 A1 | 9/2007 | Ajayan et al. |
| 2007/0222995 A1 | 9/2007 | Lu |
| 2007/0224819 A1 | 9/2007 | Sandhu |
| 2007/0227383 A1 | 10/2007 | Decre et al. |
| 2007/0249117 A1 | 10/2007 | Kang et al. |
| 2007/0281220 A1 | 12/2007 | Sandhu et al. |
| 2007/0293041 A1 | 12/2007 | Yang et al. |
| 2008/0032238 A1 | 2/2008 | Lu et al. |
| 2008/0083991 A1 | 4/2008 | Yang et al. |
| 2008/0093743 A1 | 4/2008 | Yang et al. |
| 2008/0103256 A1 | 5/2008 | Kim et al. |
| 2008/0164558 A1 | 7/2008 | Yang et al. |
| 2008/0176767 A1 | 7/2008 | Millward |
| 2008/0193658 A1 | 8/2008 | Millward |
| 2008/0217292 A1 | 9/2008 | Millward et al. |
| 2008/0233323 A1 | 9/2008 | Cheng et al. |
| 2008/0257187 A1 | 10/2008 | Millward |
| 2008/0260941 A1 | 10/2008 | Jin |
| 2008/0274413 A1 | 11/2008 | Millward |
| 2008/0286659 A1 | 11/2008 | Millward |
| 2008/0311347 A1 | 12/2008 | Millward et al. |
| 2008/0315270 A1 | 12/2008 | Marsh et al. |
| 2008/0318005 A1 | 12/2008 | Millward et al. |
| 2009/0062470 A1 | 3/2009 | Millward et al. |
| 2009/0200646 A1 | 8/2009 | Millward et al. |
| 2009/0206489 A1 | 8/2009 | Li et al. |
| 2009/0236309 A1 | 9/2009 | Millward et al. |
| 2009/0240001 A1 | 9/2009 | Regner |
| 2009/0263628 A1 | 10/2009 | Millward |
| 2009/0274887 A1 | 11/2009 | Millward et al. |
| 2010/0092873 A1 | 4/2010 | Sills et al. |
| 2010/0102415 A1 | 4/2010 | Millward et al. |
| 2010/0124826 A1 | 5/2010 | Millward et al. |
| 2010/0137496 A1 | 6/2010 | Millward et al. |
| 2010/0163180 A1 | 7/2010 | Millward et al. |
| 2010/0204402 A1 | 8/2010 | Millward et al. |
| 2010/0279062 A1 | 11/2010 | Millward |
| 2010/0316849 A1 | 12/2010 | Millward et al. |
| 2010/0323096 A1 | 12/2010 | Sills et al. |

FOREIGN PATENT DOCUMENTS

| | | |
|---|---|---|
| EP | 0784543 | 4/2000 |
| EP | 1416303 A2 | 5/2004 |
| EP | 1593164 B1 | 6/2010 |
| JP | 11080414 | 3/1999 |
| JP | 2005008882 | 1/2005 |
| JP | 2006036923 | 2/2005 |
| JP | 2006055982 | 3/2006 |
| TW | 200419017 | 10/2004 |
| TW | 200511364 | 3/2005 |
| TW | 256110 | 6/2006 |
| WO | 9007575 | 7/1990 |
| WO | 97/06013 | 2/1997 |
| WO | 99/47570 | 9/1999 |
| WO | 02081372 | 10/2002 |
| WO | 2005/122285 A2 | 12/2005 |
| WO | 2006076016 | 7/2006 |
| WO | 2006078952 | 7/2006 |
| WO | 2007/019439 A3 | 2/2007 |

| | | |
|---|---|---|
| WO | 2007013889 | 2/2007 |
| WO | 2007/024241 | 3/2007 |
| WO | 2007/024323 A2 | 3/2007 |
| WO | 2007/055041 | 5/2007 |
| WO | 2008/091741 A2 | 7/2008 |
| WO | 2008/097736 A2 | 8/2008 |
| WO | 2008096335 A2 | 8/2008 |
| WO | 2008/124219 A2 | 10/2008 |
| WO | 2008118635 A2 | 10/2008 |
| WO | 2008130847 A1 | 10/2008 |
| WO | 2008145268 A1 | 12/2008 |
| WO | 2008156977 A2 | 12/2008 |
| WO | 2009099924 A2 | 8/2009 |
| WO | 2009102551 A2 | 8/2009 |
| WO | 2009117238 A2 | 9/2009 |
| WO | 2009117243 A1 | 9/2009 |
| WO | 2009134635 A2 | 11/2009 |

OTHER PUBLICATIONS

Cheng, Joy Y., et al., Adv. Mater. 2003, vol. 15, No. 19, pp. 1599-1602, Oct. 2, 2003.
Cheng, Joy Y., et al., Applied Physics Letters, 91, 143106-143106-3 (2007), Publ online Oct. 1, 2007.
Niu, Sanjun, et al., Macromolecules, 36(7), 2428-2440, 2003 (web release date: Mar. 13, 2003) http://digitalcommons.uni.edu/cgi/viewcontent/cgi?article+1005&contect=chemeng_nanotechnology).
Parejo, Pilar Garcia, et al., J. Mater. Chem., 2006, 16, pp. 2165-2169.
Park, Cheolmin, et al., Polymer 44, 2003, 6725-6760.
Park, Miri, et al., Science, v. 276, No. 5317, p. 1401-1404, May 30, 1997.
Park, Sang-Min, et al., Adv. Mater., 2007, 19, pp. 607-611.
Park, Sung Chan, et al., Macromolecules 2007, vol. 40, No. 22, pp. 8119-8124, publ on web Oct. 4, 2007.
Peters, Richard D., et al., J. Vac. Sci. Technol. B, vol. 18, No. 6, Nov./Dec. 2000, pp. 3530-3532.
Peters, Richard D., et al., Macromolecules, vol. 35, No. 5, 2002, pp. 1822-1834, publ on web Jan. 26, 2002.
Potemkin, Igor I., et al., Macromol. Rapid Commun., 2007, 28, pp. 579-584.
Resnick, Douglas, J., et al., J. Microlith., Microfab., Microsyst., vol. 3, No. 2, Apr. 2004, pp. 316-321.
Ruiz, Richardo, et al., Adv. Mater, 2007, 19, pp. 587-591.
Ryu, Du Yeol, et al., Macromolecules, vol. 40, No. 12, 2007, pp. 4296-4300, publ on web May 19, 2007.
Saraf, Ravi R., et al., Applied Physics Letters, vol. 80, No. 23, Jun. 10, 2002, pp. 4425-4427.
Shahrjerdi, Davood, et al., IEEE Electron Device Letters, vol. 28, No. 9, Sep. 2007, pp. 793-796.
Sharma, Sadhana, et al., Applied Surface Science, 206 (2003), pp. 218-229.
Sivaniah, E., et al., Macromolecules 2003, 36, pp. 5894-5896, publ on web Jul. 15, 2003.
Sivaniah, et al., Macromolecules 2005, 38, 1837-1849, publ on Web Feb. 2, 2005.
Solak, Harun H., Journal of Physics D: Applied Physics, 2006, pp. R171-188, publ May 5, 2006.
Stoykovich, Mark P., et al., Science, vol. 308, Jun. 3, 2005, pp. 1442-1446.
Stoykovich, Mark P., et al., ACS Nano, vol. 1, No. 3, 2007, pp. 168-175, published online Oct. 6, 2007.
Sundrani, Deepak, et al., Nano Lett., vol. 4, No. 2, 2004, pp. 273-276, publ on web Dec. 25, 2003.
Sundrani, Deepak, et al., Langmuir 2004, vol. 20, No. 12, 2004, pp. 5091-5099, publ on web Mar. 11, 2004.
Sigma-Aldrich, Tutorial regarding Materials for Lithography/Nanopatterning, http://www.sigmaaldrich.com/Area_of_Interest/Chemistry/Materials_Science/Micro_and_Nanoelectronic website, retrieved Aug. 27, 2007.
Van Poll, Maaike L., et al., Angew. Chem. Int. Ed. 2007, 46, pp. 6634-6637.
Winesett, D.A., et al., Langmuir 2003, 19, pp. 8526-8535, publ on web Aug. 22, 2003.
Xu, Ting et al., Polymer 42, (2001) 9091-9095.
Wu, C.Y., et al., IEEE, 2007, pp. 153-154.
Yamaguchi, Toru, et al., Journal of Photopolymer Science and Technology, vol. 19, No. 3, 2006, pp. 385-388.
Yan, Xiaohu, et al., J. Am. Chem. Soc., vol. 126, No. 32, 2004, pp. 10059-10066.
Yang, Xiao M., et al., Macromolecules 2000, vol. 33, No. 26, 2000, pp. 9575-9582, publ on web Dec.26, 2000.
Yurt, Serkan, et al., Macromolecules 2006, vol. 39, No. 5, 2006, publ on web Feb. 2, 2006.
Zhang, Mingfu, et al., Adv. Mater. 2007, 19, pp. 1571-1576, published online May 15, 2007.
Bae, Joonwon, "Surface Modification Using Photo-Crosslinkable Random Copolymers", Abstract submitted for the Mar. 2006 meeting of The American Physical Society, submitted Nov. 30, 2005.
Bang, Joona, "The Effect of Humidity on the Ordering of Tri-block Copolymer Thin Films," Abstract submitted for the Mar. 2007 meeting of The American Physical Society, submitted Nov. 20, 2006.
Bass, Robert B., et al., "Microcontact Printing with Octadecanethiol", Applied Surface Science, 226(4), pp. 335-340, Apr. 2004, http://www.ece.virginia.edu/UVML/sis/Papers/rbbpapers/assoct.pdf.
Bearinger, J.P., et al., Nature Materials 2, 259-264, 2003, publ online Mar. 23, 2003.
Black, C.T., IEEE 2005 Custom Integrated Circuits Conference, pp. 87-91.
Black, C.T., et al., IBM J. Res. & Dev., vol. 51, No. 5, Sep. 2007, pp. 605-633.
Black, Charles T., ACSNano, vol. 1, No. 3, 2007, American Chemical Society, pp. 147-150, publ online Oct. 31, 2007.
Black, Charles T., et al., IEEE Electronon Device Letters, vol. 25, No. 9, Sep. 2004, pp. 622-624.
Botelho do Rego, A.M., et al., Surface Science, 482-485 (2001), pp. 1228-1234.
Brydson, Rik M., et al. (chapter authors), "Generic Methodologies for Nanotechnology: Classification and Fabrication", Nanoscale Science and Technology, edited by R.W. Kelsall, et al., 2005 John Wiley & Sons, Ltd., (published online: Dec. 20, 2005) (http://www3.interscience.wiley.com/cgi-bin/summary/112217550/SUMMARY).
Canaria, Christi A., et al., "Formation and Removal of Alkylthiolate Self-Assembled Monolayers on Gold in Aqueous Solutions", Lab Chip 6, 289-295 (2006), http://www.rsc.org/publishing/journals/LC/article.asp?doi=b51066c) (Abstract).
Chandekar, Amol, et al., "Template-Directed Adsorption of block Copolymers on Alkanethiol-Patterned Gold Surfaces," (circa 2006), http://www.nano.neu.edu/industry/industry_showcase/industry_day/documents/Chandekar.pdf) (Powerpoint template for scientific posters (Swarthmore College)).
Cheng, Joy T., et al., Nano Letters, vol. 0, No. 0, A-E, published on Web Aug. 16, 2006.
Daoulas Kostas Ch., et al., Physical Review Letters 96, week ending Jan. 27, 2006, pp. 036104-1-3.
Desai, Dr. Trejal A., et al., Business Briefing: Medical Device Manufacturing & Technology, 2002.
Edwards, Erik W., et al., Journal of Polymer Science: Part B Polymer Physics, vol. 43, 3444-3459, 2005.
Edwards, Erik W., et al., Advanced Mater, 16, No. 15, Aug. 4, 2004, pp. 1315-1319.
Fasolka, Michael J. et al., Macromolecules 2000, vol. 33, No. 15, pp. 5702-5712, publ on web Jun. 29,2000.
Gates, Byron D., et al., Annu. Rev. Mater. Res. 2004, 34:339-72, publ online Mar. 26, 2004.
Ge, Zhenbin, et al., PRL 96, 186101-1—186101-4, The American Physical Society, week ending May 12, 2006.
Genua, A., et al., Nanotechnology, 18(2007), pp. 1-7, published Apr. 27, 2007.
Gillmor, S.D., et al., Langmuir 2000, vol. 16, No. 18, 2000, pp. 7223-7228, publ on web Aug. 5, 2000.
Hamley, I. W., "Introduction to Block Copolymers", Developments in Block Copolymers Science and Technology, 2004, John Wiley & Sons, Ltd., pp. 1-29.

Hermans, Thomas M., et al., "Application of Solvent-Directed Assembly of Block Copolymers to the Synthesis of Nanostructured Materials with Low Dielectric Constants", Angewandte Chem. Int. Ed. 2006, 45, pp. 6648-6652.
Hutchison, J. Brian, et al., Chem. Mater., vol. 17, No. 19, 2005, pp. 4789-4797, publ on web Aug. 25, 2005.
In, Insik, et al., Langmuir, vol. 22, No. 18, 2006, pp. 7855-7860, publ on web Aug. 1, 2006.
Kim, Sang Ouk, et al., Nature, vol. 424, Jul. 24, 2003, pp. 411-414.
Kim, Sang Ouk, et al., Adv. Mater., 2007, 19, pp. 3271-3275.
Kim, Seung Hyun, et al., Macromolecules 2006, vol. 39, No. 24, 2006, pp. 8473-8479, publ on web Oct. 25, 2006.
Kim, Seung Hyun, et al., Advanced Mater., vol. 16, No. 23-24, pp. 2119-2123, Dec. 17, 2004.
Krishnamoorthy, Sivashankar, et al., MaterialsToday, vol. 9, No. 9, Sep. 2006, pp. 40-47.
La, Young-Hye, et al., Chem. Mater, 2007, vol. 19, No. 18, pp. 4538-4544. publ on web Jul. 28, 2007.
Laracuente, A.R., et al., Surface Science 545, 2003, pp. 70-84.
Lentz, David, et al., "Whole Wafer Imprint Patterning Using Step and Flash Imprint Lithography: A Manufacturing Solution for Sub 100 nm Patterning", SPIE Advanced Lithography Paper, http://molecularimprints.com/NewsEvents/tech_articles/new_articles/SPIE_07_MII_WW_Paper.pdf), Feb. 2007, pp. 1-10.
Li, Mingqi, et al., MaterialsToday, vol. 9, No. 9, Sep. 2006, pp. 30-39.
Li, Xue, et al., Polymer 48 (2007), pp. 2434-2443, available online Feb. 25, 2007.
Lin, Zhiqun, et al., Adv. Mater. 2002, 14 No. 19, Oct. 2, pp. 1373-1376.
Lin-Gibson, Sheng, et al., Macromolecules 2005, 38, pp. 2897-2902, publ on web Mar. 8, 2005.
Malkoch, Michael, et al., Chem. Commun., 2006, pp. 2774-2776, publ on web Jun. 1, 2006.
Mansky, P., et al., Science, vol. 275, Mar. 7, 1997, pp. 1458-1460.
Maye, Mathew A., et al., Journal of Chemical Education, vol. 79, No. 2, Feb. 2002, pp. 207-210.
Metters, Andrew, et al., Biomacromolecules 2005, 6, pp. 290-301, 2005, publ on web Nov. 13, 2004.
Meyer, Evelyn, et al., Macromollecular Mater. Eng., 276/277, 2000, pp. 44-50.
Mezzenga, Raffaele, et al., Langmuir 2003, vol. 19, No. 20, 2003, pp. 8144-8147, publ on web Aug. 29, 2003.
Mindel, Joseph., et al., "A Study of Bredig Platinum Sols", The Chemical Laboratories of New York University, vol. 65, pp. 2112.
Naito, et al., IEEE Transactions on Magnetics, vol. 38, No. 5, Sep. 2002, pp. 1949-1951.
Nealey, Paul F., et al., "Self-Assembling Resists for Nanolithography", IEEE 2005.
Nguyen, Kytai, et al., Biomaterials 23, 2002, pp. 4307-4314.
Arshady et al., Makromol. Chem., 1976, vol. 177, p. 2911-2918.
Bang, J. Abstract submitted for the Mar. '06 meeting of the American Physical Society, submitted Nov. 2005 [online], accessed via the Internet [retrieved on Apr. 5, 2010], URL: <http://absimage.aps.org/image/MWS_MAR06-2005-003641.pdf>.
Candau et al., Polymer, 1977, vol. 18, p. 1253-1257, Dec. 1977.
Hawker et al., Facile Synthesis of Block Copolymers for Nanolithographic Applications; Polymer Reprints, 2005.
Nishikubo, T., American Chemical Society Symposium Series, 1997, p. 214-230.
Berry, B.C., et al., "Effects of Zone Annealing on Thin Films of Block Copolymers", National Institute of Standard and Technology, Polymers Division, Gaithersburg, MD., 2007.
Black, C.T., Applied Physics Letters 87, 163116-1 to 1163116-3, 2005, published online Oct. 13, 2005.
Black, Charles T., IEEE Transactions on Nanotechnology, vol. 3, No. 3, Sep. 2004, pp. 412-415.
Cavicchi, Kevin A., et al., Macromolecules 2007, vol. 40, 2007, pp. 1181-1186, publ on web Jan. 24, 2007.
Gudipati, Chakravarthy S., et al., Journal of Polymer Science Part A: Polymer Chemistry, vol. 42, pp. 6193-6208.
Guo, Kai, et al., Abstract of "Synthesis and Characterization of Novel Biodegradable Unsaturated Poly(ester amide)/Poly(ethylene glycol) Diacrylate Hydrogels", Journal of Polymer Science Part A: Polymer Chemistry, vol. 43, Issue 17, pp. 3932-3944, 2005 Wiley Periodicals, Inc.
Karim, Alamgir et al., "Control of Ordering Kinetics and Morphology Using Zone Annealing of Thin Block Copolymer Filmes", Abstract submitted for the Mar. 2007 Meeting of The American Physical Society, Nov. 20, 2006.
Kim, Seung Hyun, et al., Adv. Mater. 2004, 16, No. 3, Feb. 3, pp. 226-231.
Park, Dae-Ho, Nanotechnology 18, 2007, 355304, pp. 1-7, Aug. 8, 2007.
Peng, Juan et al., Macromol. Rapid Commun. 2007, 28, 1422-1428.
Rogers, John A., ACS Nano, vol. 1, No. 3, pp. 151-153, 2007.
Rozkiewicz, Dorota I., et al., Angew. Chem. Int. Ed., 2006, 45, pp. 5292-5296.
Ruiz, Ricardo et al., Science, vol. 321, Aug. 15, 2008, pp. 936-939.
Segalman, Rachel A., Materials Science and Engineering R 48 (2005), pp. 191-226.
Srinvivasan, Charan, et al., ACS Nano, vol. 1, No. 3, pp. 191-201, 2007, publ online Oct. 17, 2007.
Xiao, Shuaigang et al., Nanotechnology 16 (2005) S324-S329, Apr. 15, 2005.
Jun, et al., Langmuir, 2002, 18(9), pp. 3415-3417, Abstract only, web publ date Apr. 3, 2002.
Balsara et al, CPIMA, IRG Technical Programs, Synthesis and application of Nanostructured Materials, Leland Stanford Junior Univ., 2006, http://www.stanford.edu/group/cpima/irg/irg_1.htm, printed Jul. 1, 2009.
Bulpitt, Paul et al, Journal of Biomedical Materials Research, vol. 47, Issue 2, pp. 152-169, Abstract only, publ online Aug. 13, 1999.
Elisseeff J., et al., Journal of Biomedical Materials Research, 51(2): 164-171, Aug. 2000, Abstract only.
Gelest Inc., Silane Coupling Agents: Connecting Across Boundaries, pp. 1-56, 2006.
Ji, Shengxiang, et al., Preparation of Neutral Wetting Brushes for Block Copolymer Films from Homopolymer Blends, submitted to Advanced Materials, 20(16): 3054-3060; published online Jul. 7, 2008.
Ji, Shengxiang, et al., Macromolecules, 2008, 41(23): 9098-9103.
Kim, SH, J Biomater Appl., 2000 Jul; 15(1): 23-46 Abstract only.
Kim, SH, J Biomater Res., Mar. 15, 2000; 49(4): 517-27 Abstract only.
Kim, IS, et al., Int J Pharm., Sep. 15, 2000; 205(1-2): 109-16, Abstract only.
Li, Wai-kin, et al, J. Vac. Sci. Technol. B 25(6), Nov./Dec. 2007, pp. 1982-1984, publ online Dec. 6, 2007.
Lutolf, M.P., et al, Nature Biotechnology, 23, 47-55 (2005), Abstract only, publ online Jan. 6, 2005.
Martens, P., et al., Polymer, vol. 41, Issue 21, Oct. 2000, pp. 7715-7722, Abstract only.
Matsuda, T., et al., ASAIO J, Jul.-Sep. 1992; 38(3): M154-7, Abstract only.
Sawhney, Amarpreet S., et al., Macromolecules 1993, 26, 581-587, Abstract only.
Wathier, Michel, et al., J. Am. Chem. Soc., 2004, 126 (40), pp. 12744-12745, Abstract only, web publ date Sep. 21, 2004.
Wang, C., et al., Electrochimica Acta 52 (2006), pp. 704-709, available online Jul. 12, 2006.
Black, C.T., Proc. of Spie, vol. 6153, 615302 (2006).
Darling, S.B., Progress in Polymer Science, vol. 32, No. 10, Sep. 28, 2007, pp. 1152-1204.
Harrison, Christopher et al., Polymer, vol. 39, No. 13, pp. 2733-2744, 1998.
Kim, Su-Jin, et al., J. Vac. Sci. Technol. B26(1), Jan./Feb. 2008, 189-194.
La, Young-Hye, et al., J. Vac. Sci. Technol. B 25(6), Nov./Dec. 2007, pp. 2508-2513.
Olayo-Valles, Roberto et al., J. Mater. Chem, 2004, 14, 2729-2731, publ on web Aug. 18, 2004.
Yang, XiaoMin, et al., J. Vac. Sci. Technol. B 22(6), Nov./Dec. 2004, 3331-3334.
Ali, H.A., et al., Solid-State Electronics 46 (2002), 1639-1642.

He, Yiyong et al., J. Am. Chem. Soc. 2006, 128, 2745-2750, published on web Feb. 2, 2006.

Berry et al., Orientational Order in Block Copolymer Films Zone Annealed below the Order-Disorder Transition Temperature, Nano Letters vol. 7, No. 9 Aug. 2007, p. 2789-2794.

Fukunaga et al., Self-Assembly of Block Copolymer Thin Films Having a Half-Domain-Spacing Thickness: Nonequilibrium Pathways to Achieve Equilibrium Brush Layers Parallel to Substrate, Macromolecules vol. 39, Aug. 2006, p. 6171-6179.

Hammond et al., Temperature Dependence of Order, Disorder, and Defects in Laterally Confined Diblock Copolymer Cylinder Monolayers, Macromolecules vol. 38, Jul. 2005; p. 6575-6585.

Knoll et al., Phase Behavior in Thin Films of Cylinder-Forming Block Copolymers, Physical Review Letters vol. 89, No. 3 Jul. 2002.

Zehner, Robert W. et al., Langmuir, vol. 14, No. 2, pp. 241-244, Jan. 20, 1998.

* cited by examiner

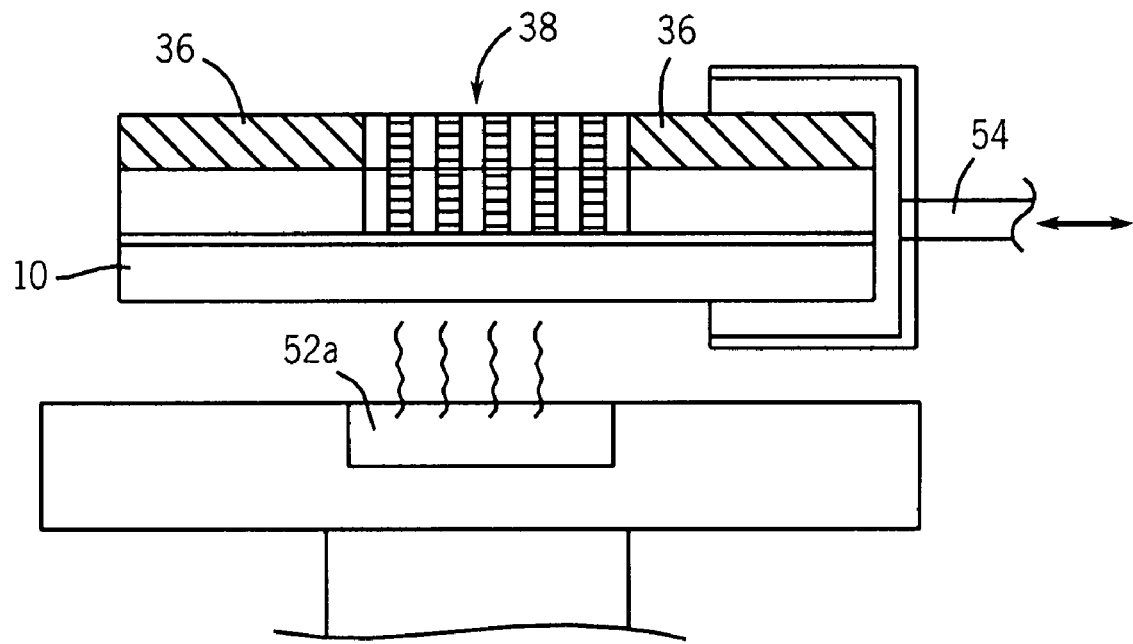
FIG. 11A
FIG. 11B
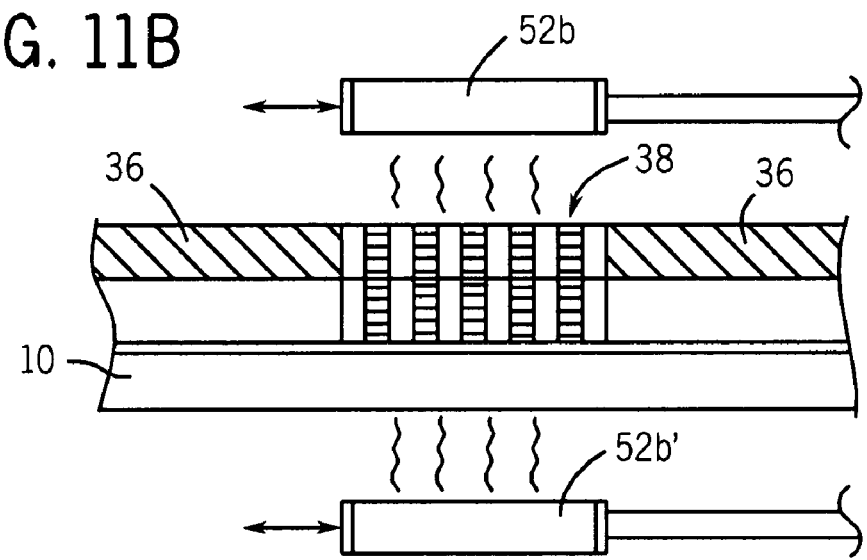

US 8,083,953 B2

REGISTERED STRUCTURE FORMATION VIA THE APPLICATION OF DIRECTED THERMAL ENERGY TO DIBLOCK COPOLYMER FILMS

TECHNICAL FIELD

Embodiments of the invention relate to methods of fabricating nanoscale linear arrays of microstructures and microchannels by use of thin films of self-assembling block copolymers, and devices resulting from those methods.

BACKGROUND OF THE INVENTION

As the development of nanoscale mechanical, electrical, chemical and biological devices and systems increases, new processes and materials are needed to fabricate nanoscale devices and components. Conventional optical lithographic processing methods are not able to accommodate fabrication of structures and features much below the 100 nm level. The use of self assembling diblock copolymers presents another route to patterning at nanometer dimensions. Diblock copolymer films spontaneously assembly into periodic structures by microphase separation of the constituent polymer blocks after annealing, for example by thermal annealing above the glass transition temperature of the polymer or by solvent annealing, forming ordered domains at nanometer-scale dimensions. Following self assembly, one block of the copolymer can be selectively removed and the remaining patterned film used as an etch mask for patterning nanosized features into the underlying substrate. Since the domain sizes and periods ($L_o$) involved in this method are determined by the chain length of a block copolymer (MW), resolution can exceed other techniques such as conventional photolithography, while the cost of the technique is far less than electron beam lithography or EUV photolithography which have comparable resolution.

The film morphology, including the size and shape of the microphase-separated domains, can be controlled by the molecular weight and volume fraction of the AB blocks of a diblock copolymer to produce lamellar, cylindrical, or spherical morphologies, among others. For example, for volume fractions at ratios greater than about 80:20 of the two blocks (AB) of a diblock polymer, a block copolymer film will microphase separate and self-assemble into a periodic spherical domains with spheres of polymer B surrounded by a matrix of polymer A. For ratios of the two blocks between about 60:40 and 80:20, the diblock copolymer assembles into a periodic hexagonal close-packed or honeycomb array of cylinders of polymer B within a matrix of polymer A. For ratios between about 50:50 and 60:40, lamellar domains or alternating stripes of the blocks are formed. Domain size typically ranges from 5-50 nm.

Diblock copolymer thin films of cylindrical and lamellar phases may both form striped phases relative to an interface. For cylindrical phase films, a striped pattern results from parallel cylinder orientation, while for lamellar phase films, a striped pattern results from perpendicular domain orientation. From a top down view, perpendicular-oriented lamellae and parallel-oriented cylinders appear similar, e.g., as parallel lines.

Graphoepitaxy techniques using defined topography such as trench edges have been used in an attempt to orient and order copolymer domains and control registration and alignment of the self-assembled blocks to form a desired pattern. By comparison, thin films prepared on a flat substrate and annealed do not have any preferential orientation of domains and will assemble into a disordered fingerprint-like structure despite extensive annealing. Although registered and ordered arrays of cylinders have been produced within trenches, the fabrication of an ordered array of repeat structures outside of the confines of trenches and over large areas has not been realized in a manufacturable process.

It would be useful to provide a method of fabricating films of linear arrays of ordered nanostructures that overcome these problems.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 2A-6A illustrate diagrammatic top plan views of the substrate of FIG. 1A at various stages of the fabrication of a self-assembled block copolymer film according to an embodiment of the present disclosure.

FIGS. 2B to 6B and 2C to 6C illustrate elevational, cross-sectional views of embodiments of a portion of the substrate depicted in FIGS. 2A-6A taken, respectively, along lines 2B/2C-2B/2C to lines 6B/6C-6B/6C.

FIGS. 11A-11B illustrate embodiments of heating the substrate of FIG. 5B by zoned annealing techniques.

DETAILED DESCRIPTION OF THE INVENTION

Figure 1A:
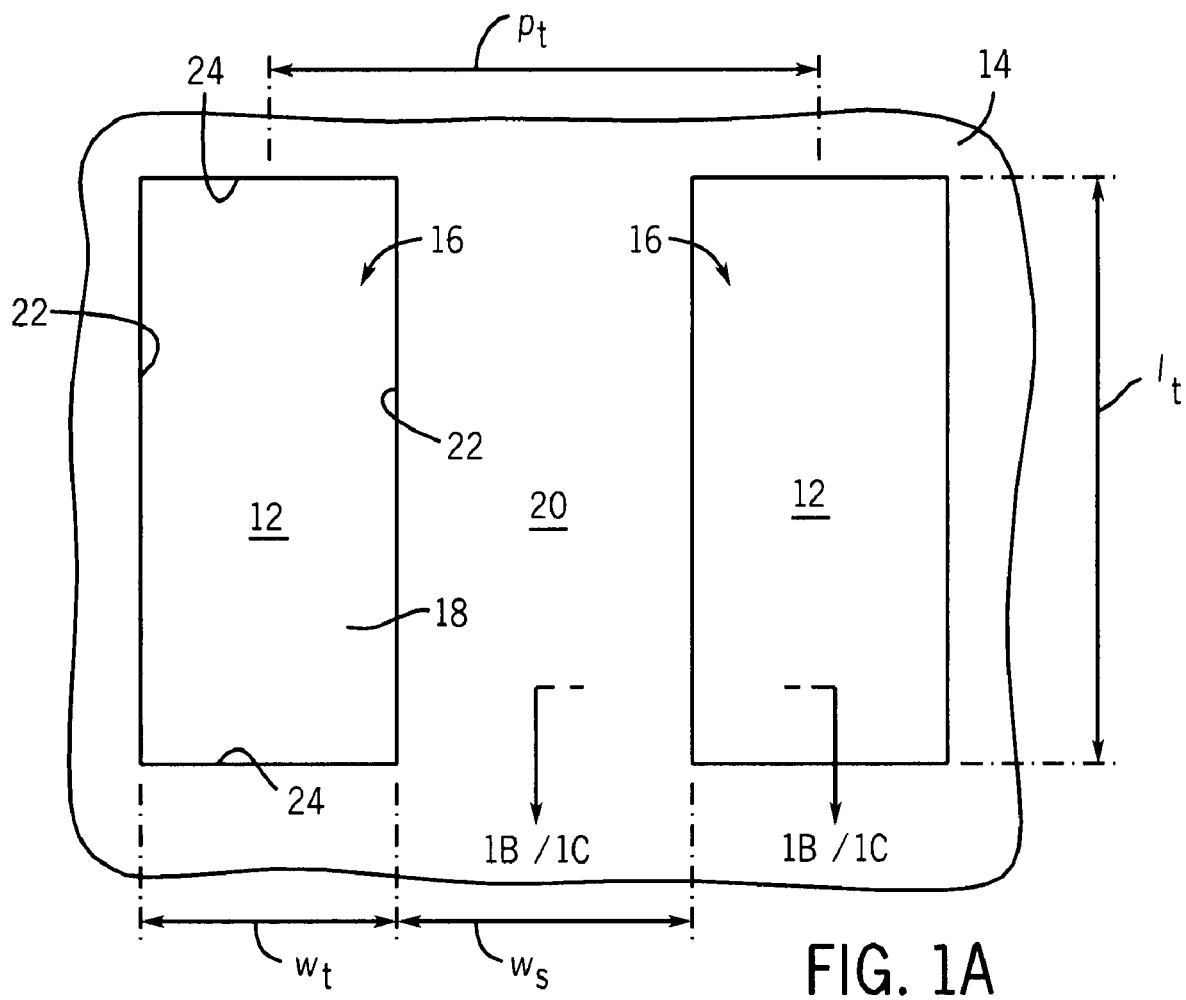
FIG. 1A illustrates a diagrammatic top plan view of a portion of a substrate at a preliminary processing stage according to an embodiment of the present disclosure, showing the substrate with trenches.

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

"$L_o$" is the inherent pitch (bulk period or repeat unit) of structures that self assemble upon annealing from a self-assembling (SA) block copolymer or a blend of a block copolymer with one or more of its constituent homopolymers.

Processing conditions of embodiments of the invention use a graphoepitaxy technique utilizing the sidewalls of trenches as constraints to induce orientation and registration of a first film of a self assembling diblock copolymer to form an ordered linear array pattern registered to the trench sidewalls. The first polymer film is then used as a template or base layer for inducing the ordering of a subsequently deposited lamellar-phase block copolymer film such that, upon annealing, the lamellar domains within the trenches orient perpendicularly and are registered to the underlying structures, resulting in a stacked double- or multi-layer structure having a striped pattern.

Steps in a method for fabricating thin films from self assembling (SA) block copolymers that define nanometer-scale linear array patterns according to embodiments of the invention are illustrated in FIGS. 1A-12D.

The method first forms a multi-layer pattern within trenches by forming a polymer base film or template with ordered structures within the trenches for inducing the ordering of an overlying lamellar phase block copolymer film such that the lamellar domains are oriented perpendicularly and registered to the underlying assembled domains of the base film.

The base layer within the trenches can be formed from a lamellar-phase block copolymer film, which upon annealing forms a registered lamellar array of alternating polymer-rich blocks that extend the length and are oriented parallel to the sidewalls and perpendicular to the floor of the trenches. In other embodiments, the base layer is formed from a cylindrical-phase block copolymer material which, upon annealing, forms lines of half-cylinders in a polymer matrix extending the length and oriented parallel to the sidewalls and floor of the trenches. The assembled base film is then used as a template for inducing the ordering of an overlying lamellar-phase block copolymer film such that the lamellar domains of the annealed film are oriented perpendicularly and registered to the underlying pattern of the base film within the trenches.

To produce a base polymer film within the trenches using a lamellar-phase block copolymer, the surface of the sidewalls and edges of the trenches are preferential wetting by one block of the copolymer and the trench floors are neutral wetting (equal affinity for both blocks of the copolymer) to allow both blocks of the copolymer material to wet the floor of the trench. Entropic forces drive the wetting of a neutral wetting surface by both blocks, resulting in the formation of a layer of perpendicular lamellae across the width of each trench.

Figure 1B:
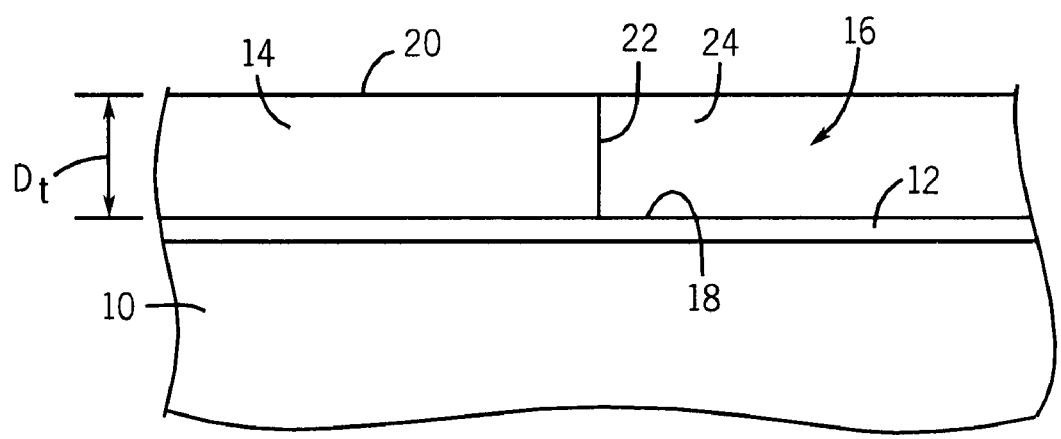
FIGS. 1B-1C are elevational, cross-sectional views of embodiments of the substrate depicted in FIG. 1A taken along lines 1B/1C-1B/1C.

In an embodiment shown in FIGS. 1A-1B, a substrate 10 is provided bearing a neutral wetting surface. The substrate 10 can comprise, for example, silicon (with native oxide), oxide (e.g., silicon oxide, $SiO_x$), or an inorganic film. In the illustrated embodiment, a neutral wetting layer 12 is formed on the substrate 10 prior to forming the overlying material layer 14 (e.g., oxide). Etching through the material layer 14 to form the trenches 16 exposes the underlying neutral wetting layer 12 as the floor or bottom surface 18 of the trench. The trenches are separated by a spacer or crest 20 having a width ($w_s$) and are structured with opposing sidewalls 22, opposing ends or edges 24, a width ($w_t$), a length ($l_t$) and a depth ($D_t$).

A neutral wetting surface can be provided, for example, by applying a neutral wetting polymer to form a layer 12 on the surface of the substrate 10. In the use of a self-assembling (SA) diblock copolymer composed of PS-b-PMMA, a random PS:PMMA copolymer brush layer (PS-r-PMMA)) which exhibits non-preferential or neutral wetting toward PS and PMMA can be applied by spin-coating onto the surface of substrate 10. The brush can be affixed by grafting (on an oxide substrate) or by cross-linking (any surface) using UV radiation or thermal processing. For example, a random copolymer solution composed of PS and PMMA with hydroxyl end group(s) (e.g., about 58% PS) can be applied to the surface of the substrate 10 as a layer about 5-10 nm thick and end-grafted by heating at about 160° C. for about 48 hours.

In another embodiment, a surface that is neutral wetting to PS-b-PMMA can be prepared by spin coating a blanket layer of a photo- or thermally cross-linkable random copolymer such as a benzocyclobutene- or azidomethylstyrene-functionalized random copolymer of styrene and methyl methacrylate (e.g., poly(styrene-r-benzocyclobutene-r-methyl methacrylate (PS-r-PMMA-r-BCB) onto the surface of the substrate 10 prior to forming the material layer 14. For example, such a random copolymer can comprise about 42% PMMA, about (58-x)% PS and x % (e.g., about 2-3%) of either polybenzocyclobutene or poly(para-azidomethylstyrene)). An azidomethylstyrene-functionalized random copolymer can be UV crosslinked (e.g., 1-5 mW/cm^2 exposure for about 15 seconds to about 30 minutes) or thermally crosslinked (e.g., at about 170° C.). A benzocyclobutene-functionalized random copolymer can be thermally crosslinked (e.g., at about 200° C. for about 4 hours or at about 250° C. for about 10 minutes).

Another neutral wetting surface for PS-b-PMMA can be provided by hydrogen-terminated silicon, which can be prepared by a conventional process, for example, by a fluoride ion etch of a silicon substrate 10 (with native oxide present, about 12-15 Å) for example, by immersion in aqueous solution of hydrogen fluoride (HF) and buffered HF or ammonium fluoride ($NH_4F$), by HF vapor treatment, by exposure to hot $H_2$ vapor, or by a hydrogen plasma treatment (e.g., atomic hydrogen).

Figure 1C:
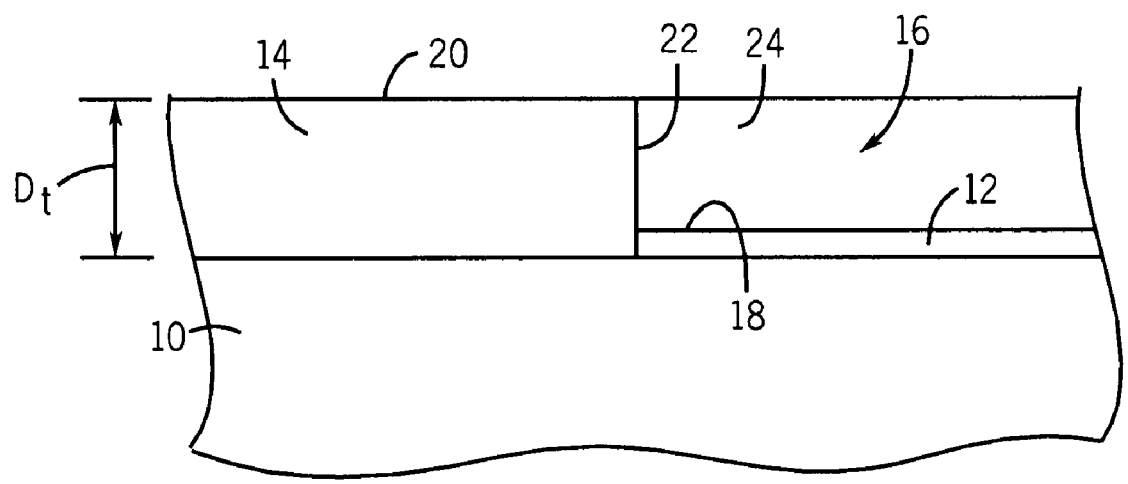

Referring now to FIG. 1C, in another embodiment, the material layer 14 can be formed on the substrate 10 and etched to form the trenches 16, and a neutral wetting material 12 then applied to the trench floors 18. For example, trench floors that are neutral wetting to PS-b-PMMA can be prepared by spin coating PS-r-PMMA-r-BCB onto the surface of the substrate 10 within the trenches and thermally crosslinking the polymer (e.g., 190° C., 4 hours) to form a crosslinked polymer mat as a neutral wetting layer 12. Capillary forces pull the random copolymer to the bottom of deep trenches. Non-crosslinked polymer material can be subsequently removed.

The trench sidewalls 22 are preferential wetting by one block of the copolymer to induce formation of lamellae as the blocks self-assemble. The material layer 14 defining the trench surfaces can be an inherently preferential wetting material, or in other embodiments, a layer of a preferential wetting material can be applied onto the surfaces of the trenches.

For example, in the use of poly(styrene-block-methyl methacrylate) (PS-b-PMMA), an oxide (e.g., silicon oxide, $SiO_x$) or a clean silicon surface (with native silicon oxide) exhibits preferential wetting toward the PMMA block to result in the assembly of a thin (e.g., ¼ pitch) interface layer of PMMA and alternating PMMA and PS lamellae (e.g., ½ pitch) within each trench in the use of a lamellar-phase block copolymer material. Other preferential wetting surfaces to PMMA can be provided, for example, by silicon nitride, silicon oxycarbide, polymethylmethacrylate (PMMA) polymer grafted to a sidewall material such as silicon oxide, and resist materials such as methacrylate-based resists. For example, a PMMA that is modified with a moiety containing one or more hydroxyl (—OH) groups (e.g., hydroxyethylmethacrylate) can be applied by spin coating and then heated (e.g., to about 170° C.) to allow the OH groups to end-graft to the oxide sidewalls 22 and ends 24 of the trenches. Non-grafted material can be removed from the neutral wetting layer 12 by rinsing with an appropriate solvent (e.g., toluene). See, for example, Mansky et al., *Science*, 1997, 275, 1458-1460, and In et al., *Langmuir*, 2006, 22, 7855-7860, the disclosures of which are incorporated by reference herein.

Figure 1D:
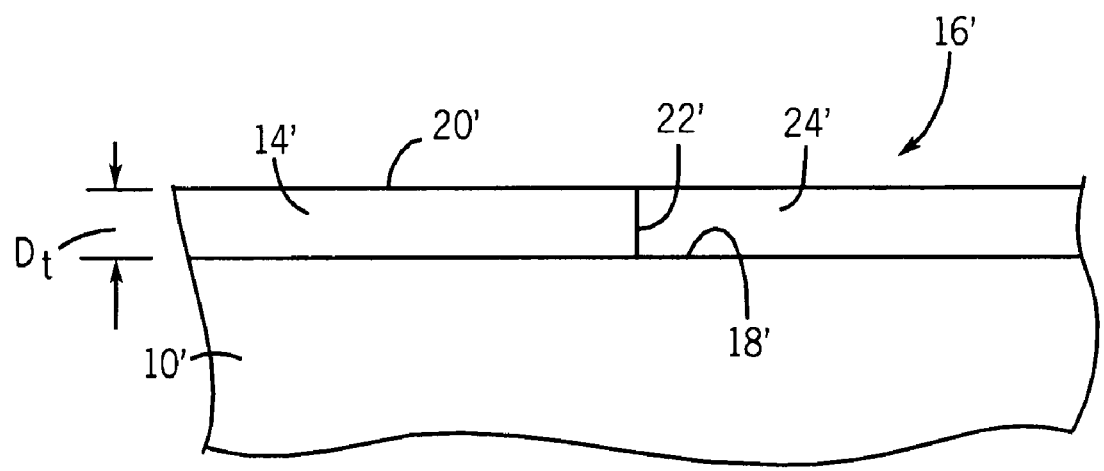
FIG. 1D is an elevational, cross-sectional view of a substrate used in another embodiment of the invention.

Referring now to FIG. 1D, in other embodiments using a cylindrical-phase block copolymer to form the base polymer film within the trenches, the surfaces of the floor 18', sidewalls 22' and the ends 24' of the trenches 16' are preferential wetting by the minority block of the copolymer to induce formation of parallel lines of half-cylinders wetting the air interface (surface exposed) down the middle of each trench aligned parallel to the trench sidewalls and floor. For example, substrate 10' can be composed of an inherently preferential wetting material such as a clean silicon surface (with native silicon oxide) and material layer 14' can be composed of oxide (e.g., $SiO_x$). Both materials exhibit preferential wetting toward the PMMA block to result in the assembly of a thin interface layer of PMMA on the trench sidewalls as well as PMMA cylinders in the center of a PS matrix within each trench. Other preferential wetting surfaces to PMMA can be provided, for example, by silicon nitride, silicon oxycarbide, and PMMA polymer grafted to a sidewall material such as silicon oxide, and resist materials such as such as methacrylate-based resists. See, for example, C. T. Black and O. Bezencenet, "Nanometer-Scale Pattern Registration and Alignment by Directed Diblock Copolymer Self-Assembly," *IEEE Transactions on Nanotechnology*, 2004, 3(3), 412-415; C. T. Black, "Self-Aligned self-assembly of multi-nanowire silicon field effect transistors," *Applied Physics Letters*, 2005, 87, 163116; R. Ruiz, R. L. Sandstrom and C. T. Black, "Induced Orientational Order in Symmetric Diblock Copolymer Thin-Films," *Advanced Materials*, 2007, 19(4), 587-591, the disclosures of which are incorporated by reference herein.

The trench sidewalls, edges and floors influence the structuring of the array of nanostructures within the trenches. The boundary conditions of the trench sidewalls in both the x- and y-axis impose a structure wherein each trench contains n number of features (i.e., cylinders or lamellae). Factors in forming a single array or layer of nanostructures within the trenches include the width and depth of the trench, the formulation of the block copolymer to achieve the desired pitch ($L_o$), and the thickness (t) of the copolymer film.

The trenches 16 are constructed with a width ($w_t$) such that a block copolymer (or blend) will self assemble upon annealing into a single layer of "n" structures spanning the width ($w_t$) of the trench, with each structure (i.e., cylinders or lamellae) being separated by a value of $L_o$ (from center-to-center). The width ($w_t$) of the trenches is a multiple of the inherent pitch value ($L_o$) of the polymer being equal to or about $nL_o$ ("$n*L_o$"), typically ranging from about n*10 to about n*100 nm (with n being the number of features or structures). In embodiments of the inventions, the depth ($D_t$) of the trenches is greater than or at about $L_o$ in using a lamellar-phase block copolymer for the base layer (FIGS. 1B-1C), and less than $L_o$ in using a cylindrical-phase block copolymer (FIG. 1D). The application and annealing of a block copolymer material having an inherent pitch value of $L_o$ in a trench having a width ($w_t$) at or about $L_o$ will result in the formation of a single layer of "n" structures spanning the width and registered to the sidewalls for the length of the trench. In some embodiments, the trench dimension is about 50-500 nm wide ($w_t$) and about 1,000-10,000 μm in length ($l_t$), with a depth ($D_t$) of about 50-500 nm in using a lamellar-forming block copolymer, and about 50-2000 nm wide ($w_t$) with a depth ($D_t$) of about 15-25 nm in using a cylinder-forming block copolymer. The width ($w_s$) of the spacer or crest 20 between adjacent trenches is at or about an integral multiple of $L_o$ such that as the film situated on the crest is annealed, the expanding registered fronts will be matched and aligned where they converge. The spacer width ($w_s$) can vary from about the width ($w_t$) of the trench 16 to up to about 10-20× the trench width.

The trenches can be formed using a lithographic tool having an exposure system capable of patterning at the scale of $L_o$ (10-100 nm). Such exposure systems include, for example, extreme ultraviolet (EUV) lithography, proximity X-rays, and electron beam (e-beam) lithography, as known and used in the art. Conventional photolithography can attain (at smallest) about 58 nm features.

Figure 2A:
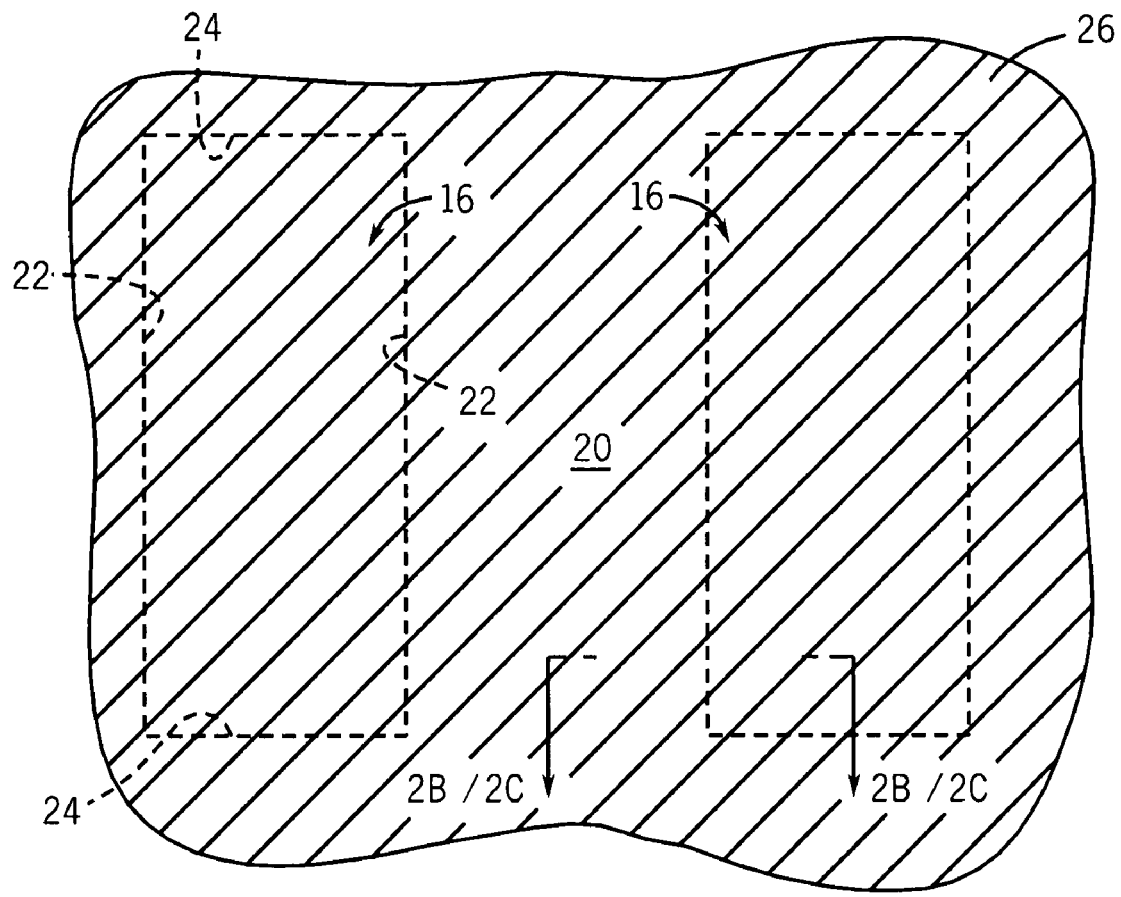
Figure 2B:
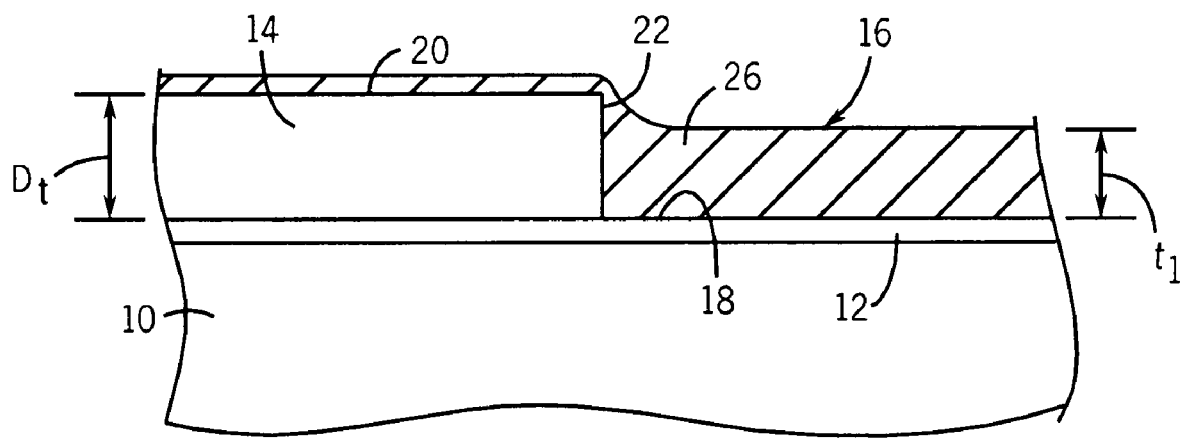
Figure 2C:
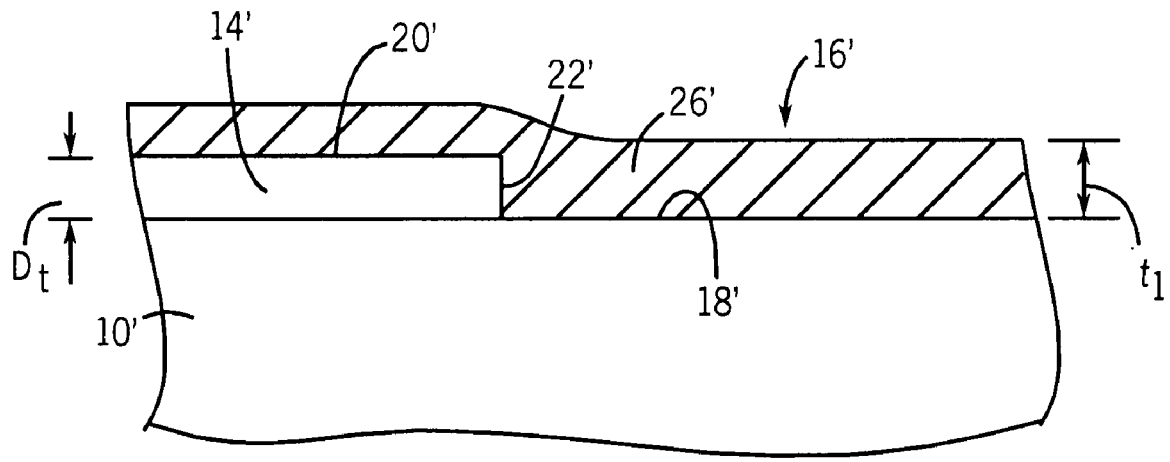

Referring now to FIGS. 2A-2C, a self-assembling (SA) block copolymer material 26 having an inherent pitch at or about $L_o$ (or a ternary blend of block copolymer and homopolymers blended to have a pitch at or about $L_o$) is then deposited, typically by spin casting (spin-coating), onto the floor 18 of the trenches. The block copolymer material can be deposited onto the patterned surface by spin casting from a dilute solution (e.g., about 0.25-2 wt % solution) of the copolymer in an organic solvent such as dichloroethane ($CH_2Cl_2$) or toluene, for example.

As illustrated in FIG. 2B, in embodiments using a lamellar-phase block copolymer for the base layer, with a trench depth ($D_t$) of greater than or at about $L_o$, a layer of the first block copolymer material 26 is deposited into the trenches 16 to a thickness ($t_1$) less than the trench depth ($D_t$), for example, at about one-half of the trench depth, and at or about the $L_o$ value of the block copolymer material such that the copolymer film layer will self assemble upon annealing to form a single layer of lamellae across the width ($w_t$) of the trench.

As shown in FIG. 2C, in embodiments using a cylindrical-phase block copolymer for the base layer, with a trench depth ($D_t$) less than $L_o$, a layer of the first block copolymer material 26 is deposited into the trenches 16 to a thickness ($t_1$) greater than the trench depth ($D_t$) but less than $L_o$ such that the copolymer film layer will self assemble upon annealing to form a single layer of parallel lines of half-cylinders across the width ($w_t$) of the trench.

A typical thickness ($t_f$) of a lamellar-phase block copolymer film 26 is about ±20% of the $L_o$ value of the polymer (e.g., about 10-100 nm) to form, for example, alternating polymer-rich lamellar blocks having a width of about $L_o$ (e.g., 25-35 nm). The thickness ($t_f$) of a cylindrical-phase block copolymer film 26 is less than $L_o$ to form parallel-oriented half-cylinders of one block having a diameter of about $L_o$ in a matrix of another block within each trench. The thickness of the film can be measured, for example, by ellipsometry techniques.

Although diblock copolymers are used in the illustrative embodiment, other types of block copolymers (i.e., triblock or triblock or multiblock copolymers) can be used. Examples of diblock copolymers include poly(styrene-block-methyl methacrylate) (PS-b-PMMA), polyethyleneoxide-polyisoprene, polyethyleneoxide-polybutadiene, polyetheyleoxide-polystyrene, polyetheleneoxide-polymethylmethacrylate, polystyrene-polyvinylpyridine, polystyrene-polyisoprene (PS-b-PI), polystyrene-polybutadiene, polybutadiene-polyvinylpyridine, and polyisoprene-polymethylmethacrylate, among others. Examples of triblock copolymers include poly (styrene-block methyl methacrylate-block-ethylene oxide). One of the polymer blocks of the block copolymer should be selectively and readily removable in order to fabricate an etch mask or template from the annealed film.

In embodiments in which the base or template layer is formed from a lamellar-forming diblock copolymer, the volume fractions of the two blocks (AB) are generally at a ratio between about 50:50 and 60:40. An example of a lamellae-forming symmetric diblock copolymer is PS-b-PMMA with a weight ratio of about 50:50 (PS:PMMA) and total molecular weight ($M_n$) of about 51 kg/mol.

In other embodiments in which the base layer is formed using a cylindrical-phase diblock copolymer, the volume fractions of the two blocks (AB) are generally at a ratio between about 60:40 and 80:20. An example of a cylindrical phase diblock copolymer material is PS-b-PMMA ($L_o$=35 nm) composed of about 70% PS and 30% PMMA (weight ratio of 70:30) with a total molecular weight ($M_n$) of 67 kg/mol to form about 20 nm diameter half-cylinder PMMA domains in a matrix of PS. To achieve an annealed base film in which the half-cylinders or lamellae are surface exposed, the Chi value of the polymer blocks (e.g., PS and PMMA) at common annealing temperatures is generally small such that the air interface is equally or non-selectively wetting to both blocks.

The block copolymer material can also be formulated as a binary or ternary blend comprising a SA block copolymer and one or more homopolymers of the same type of polymers as the polymer blocks in the block copolymer, to produce blends that swell the size of the polymer domains and increase the $L_o$ value of the polymer. The volume fraction of the homopolymers can range from 0 to about 40%. An example of a ternary diblock copolymer blend is a PS-b-PMMA/PS/PMMA blend, for example, 46K/21K PS-b-PMMA containing 40% 20K polystyrene and 20K poly(methylmethacrylate). The $L_o$ value of the polymer can also be modified by adjusting the molecular weight of the block copolymer, e.g., for lamellae, $L_o \sim (MW)^{2/3}$.

Optionally, ellipticity ("bulging") can be induced in the structures by creating a slight mismatch between the trench and the spacer widths and the inherent pitch ($L_o$) of the block copolymer or ternary blend, as described, for example, by Cheng et al., "Self-assembled One-Dimensional Nanostructure Arrays," *Nano Lett.*, 2006, 6(9), 2099-2103, the disclosure of which are incorporated by reference herein, which then reduces the stresses that result from such mismatches.

Figure 3C:
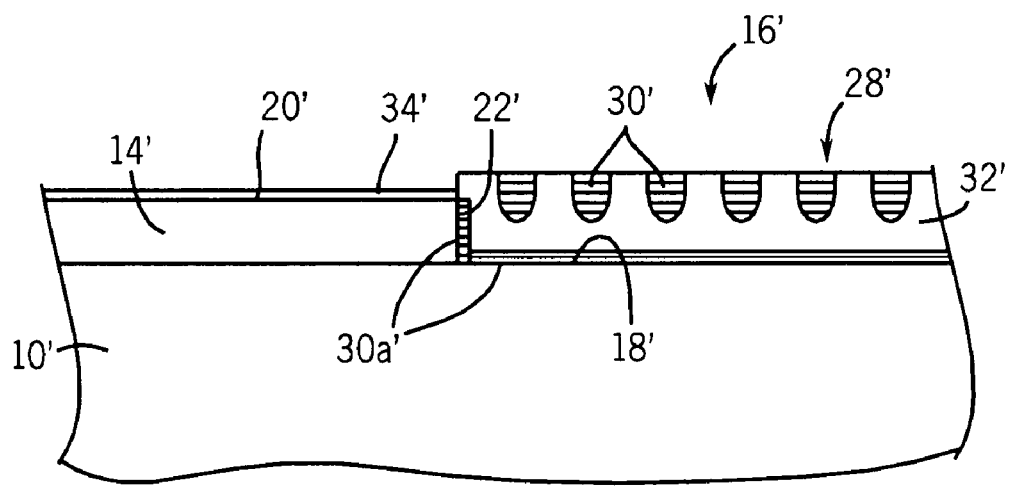
Figure 3A:
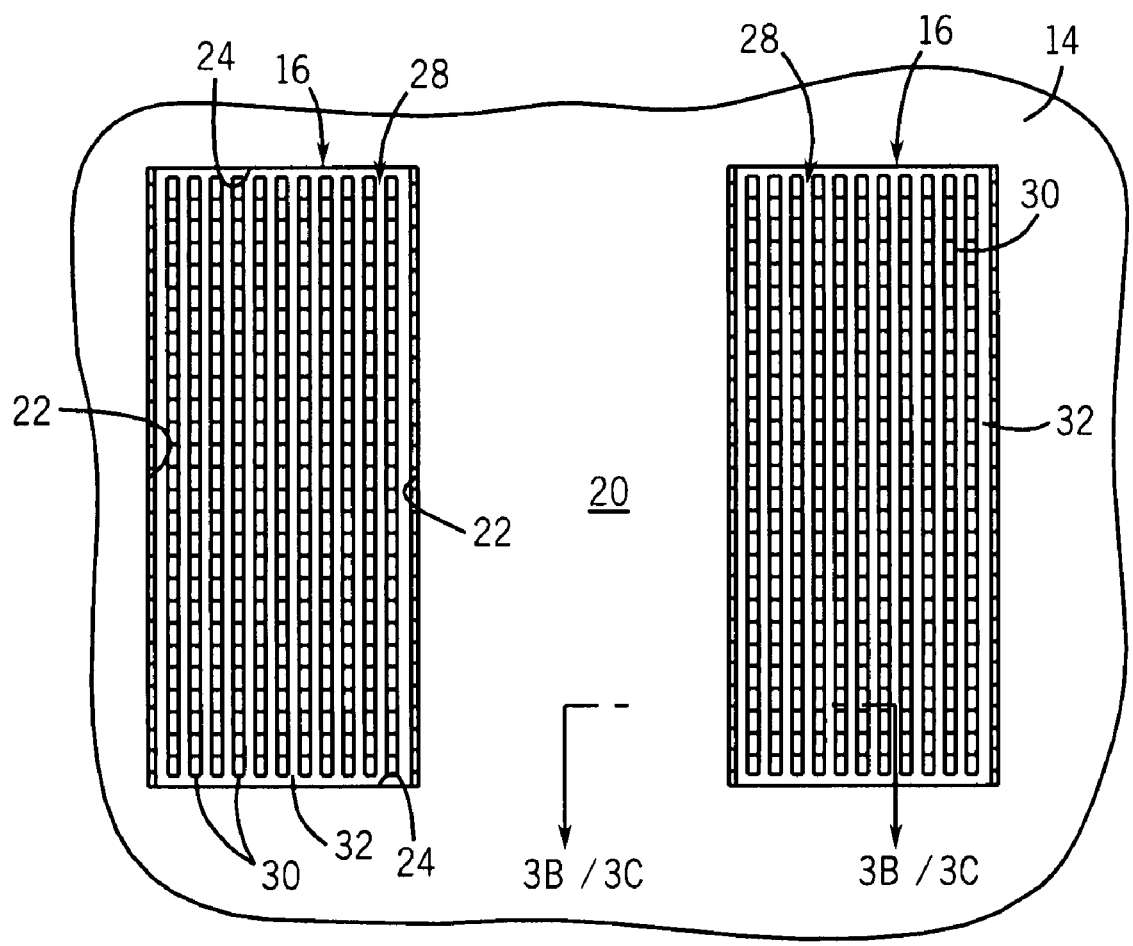
Figure 3B:
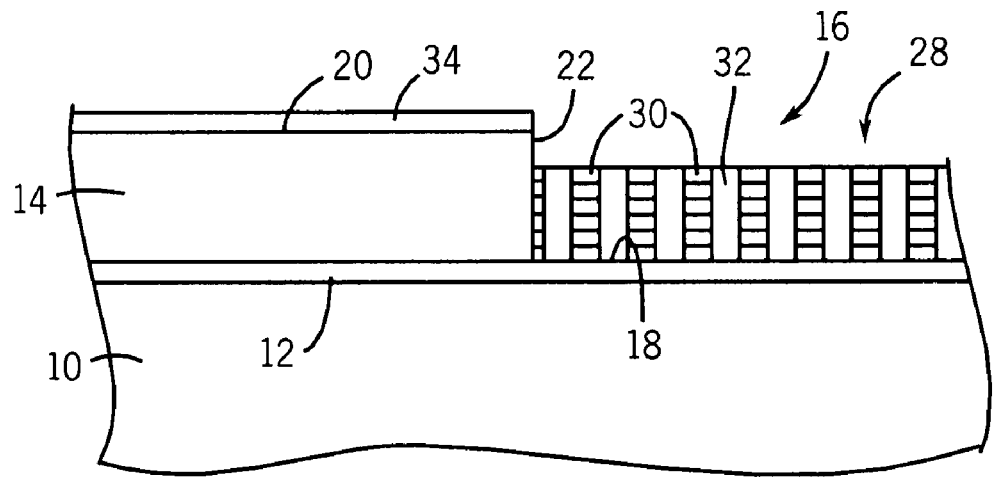

Referring now to FIGS. 3A-3C, the first block copolymer film 26 is then annealed, for example, by thermal annealing to above the glass transition temperature of the component blocks of the copolymer material to cause the polymer blocks to separate and self assemble according to the preferential and neutral wetting of the trench surfaces 16, 18, 22, to form a self-assembled block copolymer structure 28. For example, a PS-b-PMMA copolymer film can be annealed at a temperature of about 180-195° C. in a vacuum oven for about 1-24 hours to achieve the self-assembled morphology. The film can also be solvent annealed, for example, by slowly swelling both blocks of the film with a solvent, then slowly evaporating the solvent.

The constraints provided by the width ($w_t$) of the trenches and the character of the copolymer composition combined with preferential or neutral wetting surfaces within the trenches results, upon annealing, in a single layer of n elements across the width ($w_t$) of the trench. The number "n" or pitches of elements (e.g., lamellar blocks or half-cylinders) within a trench is according to the width ($w_t$) of the trench and the molecular weight (MW) of the block copolymer.

For example, as shown in FIG. 3B, a lamellar-phase block copolymer material used to form the base layer 28 will, upon annealing, self assemble into perpendicular-oriented, alternating polymer-rich blocks 30, 32 spanning the width ($w_t$) of the trench 16 at an average pitch value at or about $L_o$. For example, depositing and annealing an about 50:50 PS:PMMA block copolymer film ($M_n$=51 kg/mol; $L_o$=32 nm) in an about 250 nm wide trench will subdivide the trench into about eight (8) lamellar structures.

In another embodiment, as illustrated in FIG. 3C, annealing of a cylindrical-phase copolymer material to form the base layer 28' will result in parallel-oriented half-cylinders 30' within a polymer matrix 32' spanning the width ($w_t$) of the trench 16', with each cylinder being separated by an average value of at or about $L_o$, and an interface layer 30a' along the sidewalls 22' and floor 18'. For example, depositing and annealing a 70/30 PS:PMMA block copolymer film ($M_n$=67 kg/mol; $L_o$=35 nm) in an about 250 nm wide trench will subdivide the trench into about seven (7) half-cylinder structures.

The resulting morphologies of the annealed base film 28 (i.e., perpendicular orientation of lamellae or parallel orientation of cylinders) can be examined, for example, using atomic force microscopy (AFM), transmission electron microscopy (TEM), or scanning electron microscopy (SEM).

The annealed and ordered base film 28 is then treated to crosslink the polymer segments to fix and enhance the strength of the self-assembled polymer blocks 30, 32 within the trenches 16 (e.g., to crosslink the PS segments). The polymers can be structured to inherently crosslink (e.g., upon UV exposure), or one or both of the polymer blocks of the copolymer material can be formulated to contain a crosslinking agent.

For example, in one embodiment, the trench regions can selectively exposed through a reticle to crosslink only the self-assembled film 28 within the trenches 16. A wash can then be applied with an appropriate solvent such as toluene, to remove the non-crosslinked portions of the film 28 (e.g., on the spacer or crest 20) leaving the registered self-assembled base film within the trenches and exposing the surface of material layer 14 above/outside the trenches (e.g., the crest 20). As shown in FIGS. 3B-3C, a neutral wetting layer 34 can then be formed on the exposed surface of the material layer 14 (e.g., oxide), for example by applying and grafting or crosslinking a random copolymer brush layer (e.g., PS-r-PMMA) on the surface.

In another embodiment, the entire annealed film 28 can be crosslinked globally. A photoresist layer can be applied to pattern and expose the areas of the film outside the trench regions (e.g., over the crests 20), and the exposed portions of the film can be removed, for example by an oxygen ($O_2$) plasma treatment. The photoresist can then be removed (e.g., stripped). A neutral wetting film can then be formed on the exposed portions of the material layer 14 above the trench regions (e.g., the crests 20). In other embodiments, a film of a photo-crosslinkable, neutral wetting random copolymer can be globally applied (e.g., cast) and photoexposed through a reticle to selectively crosslink the neutral wetting film only over the portions of the material layer 14 above the trenches (e.g., the crests). Non-grafted or non-crosslinked portions of the neutral wetting film (e.g., within the trenches) can then be removed, for example, by a solvent rinse (e.g., toluene). See, for example, Hawker et al., "Improving the manufacturability and structural control of block copolymer lithography," *Abstracts of Papers*, 232nd ACS National Meeting, San Francisco, Calif., Sep. 10-14, 2006, the disclosure of which are incorporated by reference herein.

Figure 4A:
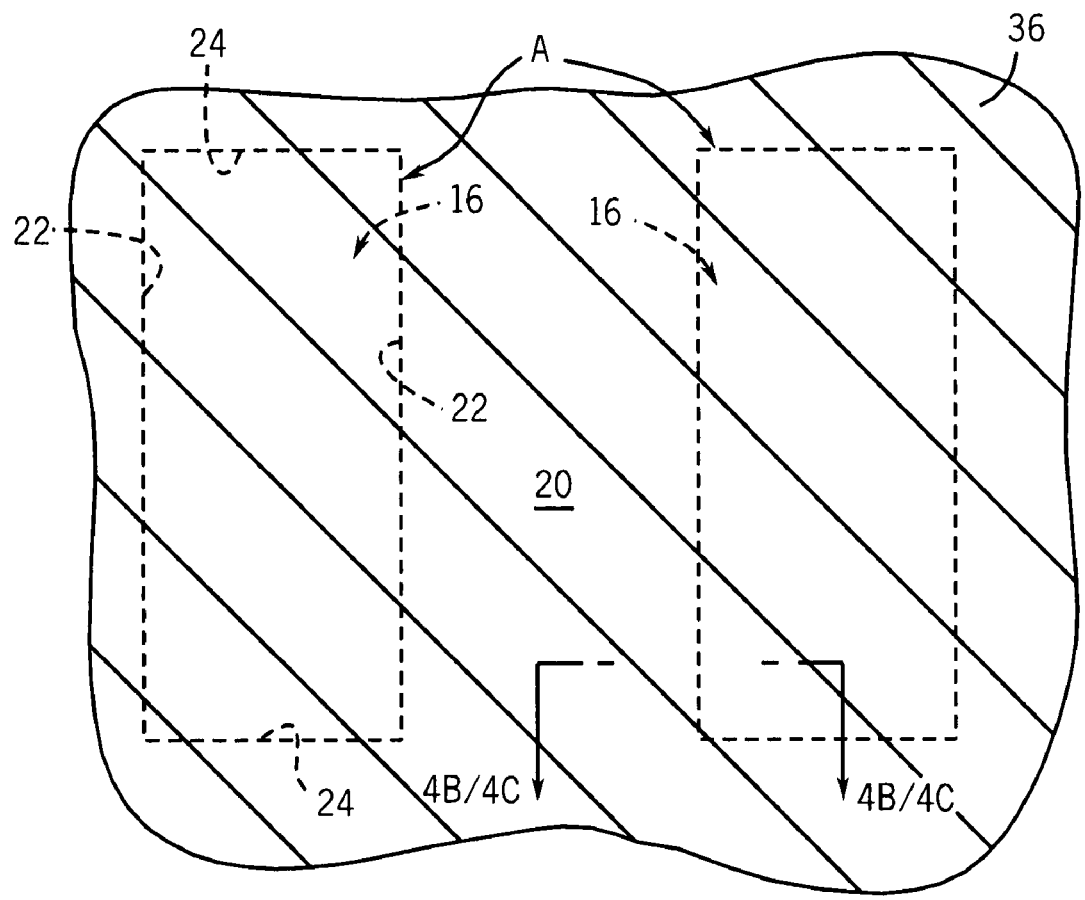
Figure 4B:
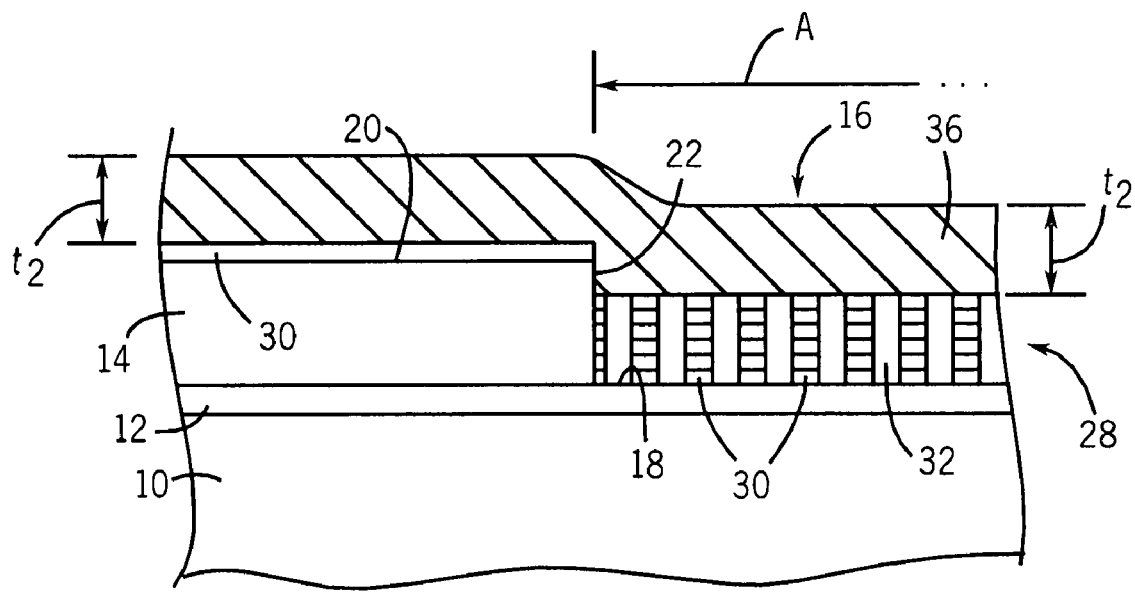
Figure 4C:
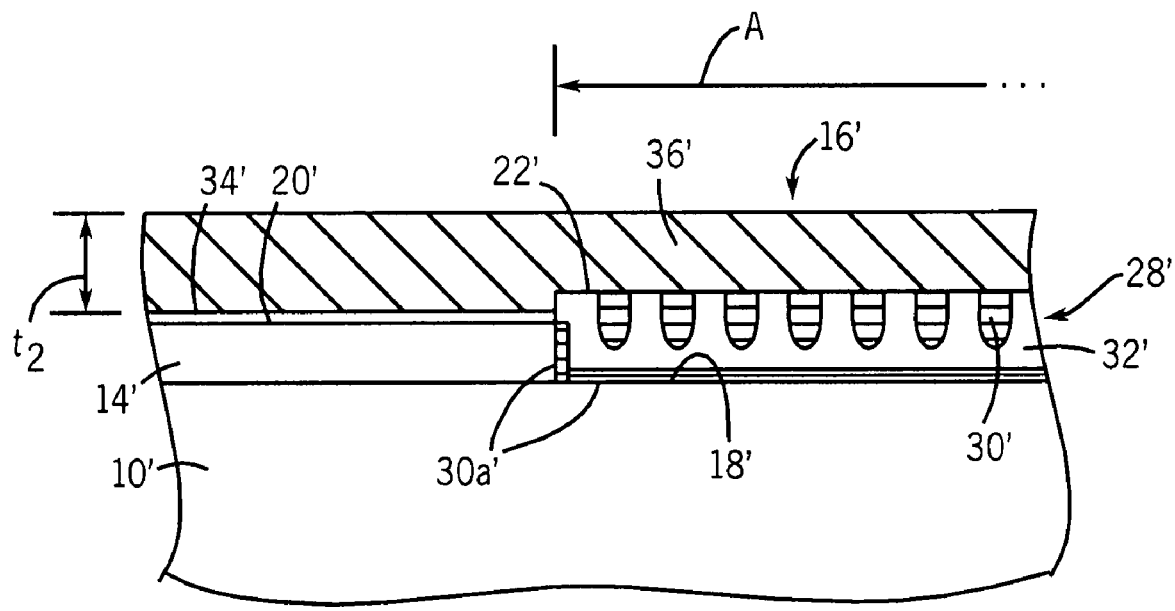

Referring now to FIGS. 4A-4C, a layer of a lamellar-phase block copolymer material 36 having an inherent pitch at or about $L_o$ (or a ternary blend of block copolymer and homopolymers blended to have a pitch at or about $L_o$) is then deposited (e.g., by spin casting) onto the annealed and crosslinked base film 28 within the trenches and onto the neutral wetting layer 34 overlying the material layer 14 (e.g., crest 20) outside the trenches 16. The copolymer material can be spin cast, for example, from a dilute solution of the copolymer in an organic solvent (e.g., about 0.25-2 wt % solution).

The lamellar-phase block copolymer layer 36 is cast over the neutral wetting layer 34 (e.g., over crest 20) and the base film 28 within the trenches to a thickness ($t_2$) at or about the $L_o$ value of the block copolymer material 36 such that, upon annealing, the copolymer film layer will self-assemble to form a single layer of perpendicular-oriented lamellar domains each having a width ($w_2$) of about $L_o$.

Figure 5C:
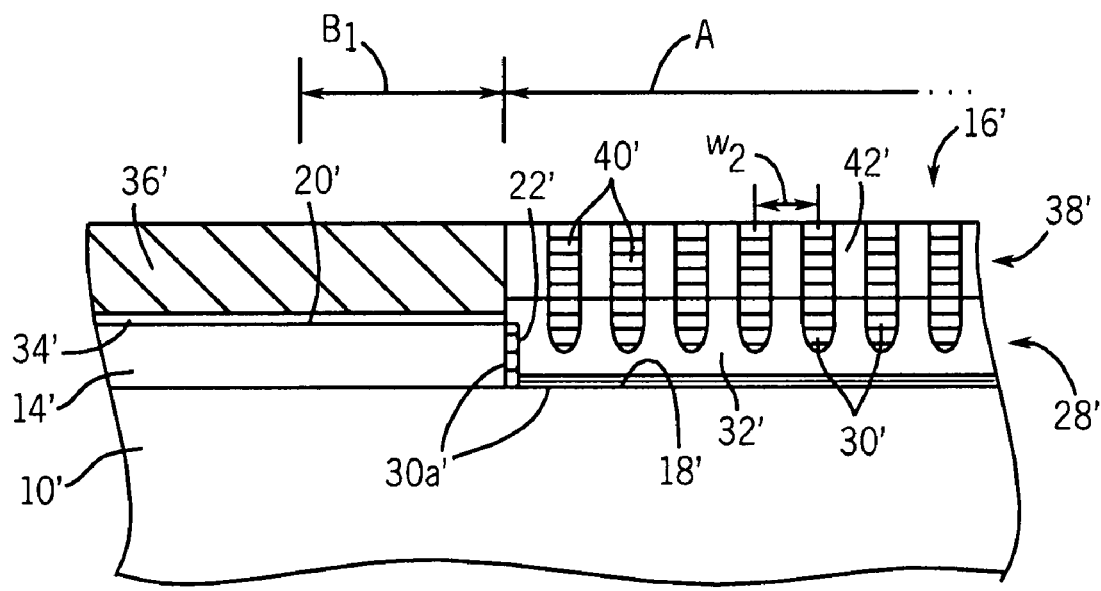
Figure 5A:
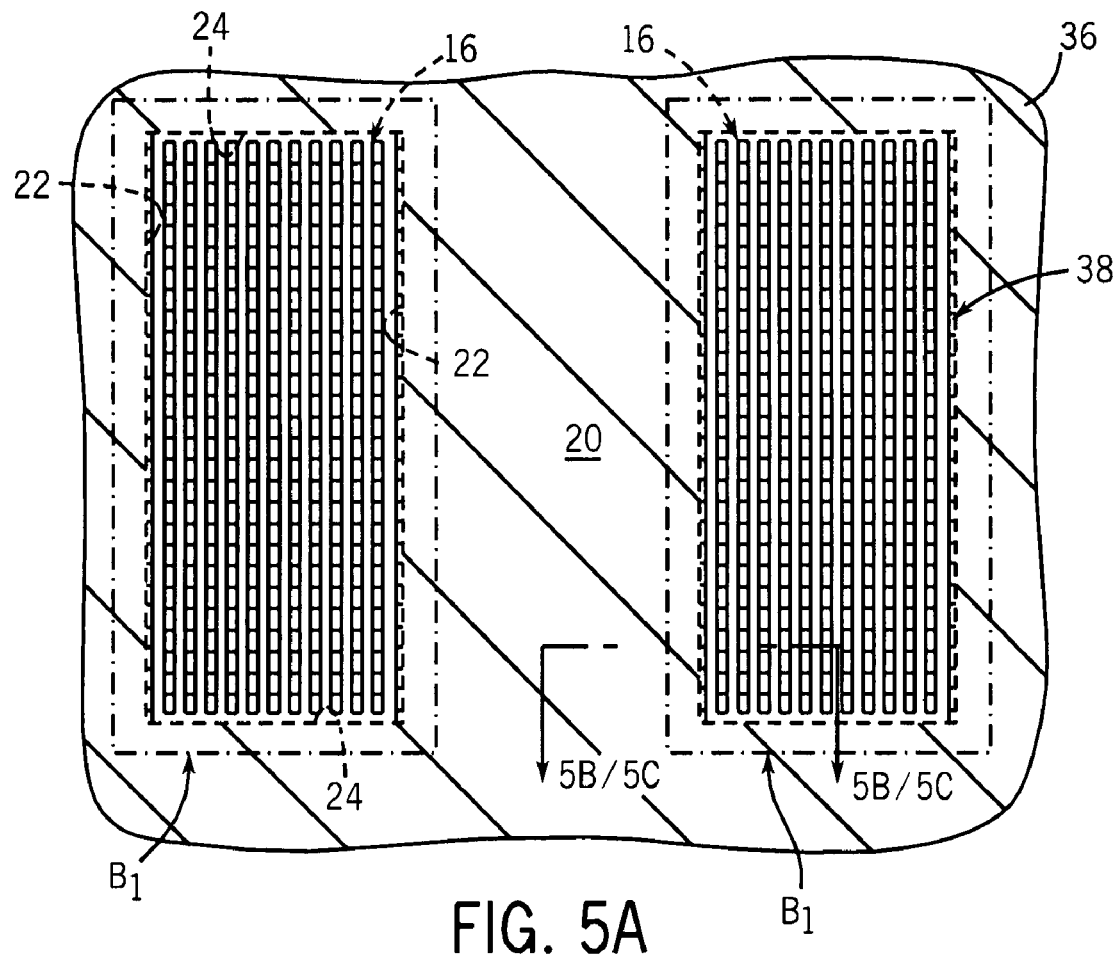
Figure 5B:
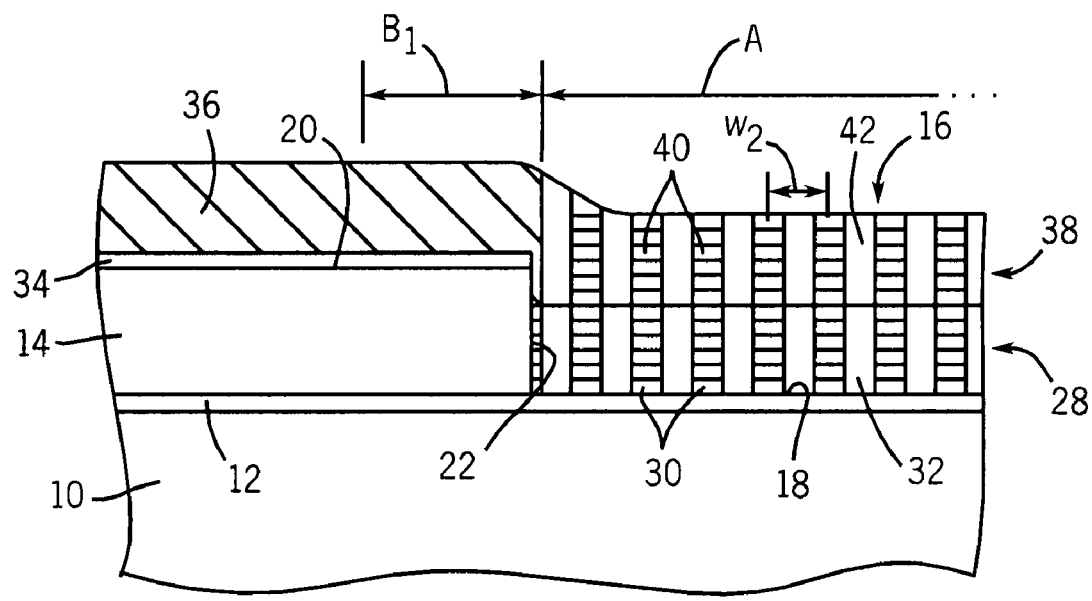

As shown in FIGS. 5A-5C, annealing of the lamellar-phase block copolymer layer 36 is then conducted to cause the polymer blocks to separate and self assemble into a film 38 composed of perpendicular-oriented lamellar-phase domains 40, 42 in a striped pattern, for example, at about 180-195° C. for a PS-b-PMMA copolymer film. An annealing process is performed to achieve ordering of the lamellar blocks across plateaus or crests 20 between the trenches 16 and other areas of the substrate that are without constraints or defined features or boundaries (e.g., trench sidewalls and/or edges) to which self-assembling copolymer blocks can align.

Current methods for annealing a block copolymer film to cause microphase separation of the polymer blocks involve placing the film-coated substrate into a vacuum oven and heating the entire film globally and simultaneously at a single set temperature and time period. However, while global heating may produce a film that is ordered and registered within the trenches, on areas of the substrate beyond the confines of the trenches that lack constraints or topographic features to which the copolymer film can self align or that will drive the self assembling blocks in a set direction, the block copolymer film will self-assemble into randomly ordered structures in a meandering fingerprint-type configuration. R. Ruiz, R. L. Sandstrom and C. T. Black, "Induced Orientational Order in Symmetric Diblock Copolymer Thin-Films," *Advanced Materials*, 2007, 19(4), 587-59. That layout and the lack of ordering of repeat structures make the film unusable for most templating applications.

Rather than performing a global heating of the film, embodiments of the invention utilize techniques for performing an anneal of the copolymer film by a localized application of thermal energy to portions of the polymer film that have registry to them.

Initially, a limited area of the lamellar-forming film 36 over and above the trenches 16, shown as dashed line "A" in FIGS. 4A-4C, is selectively heated to cause self-assembly of the polymer domains and produce ordered lamellar domains that are registered to the underlying base film 28 within the trenches. During the anneal, the base film 28 imposes an induced ordering effect on the overlying self-assembling lamellar film 36 to reproduce the underlying pattern of the base film. Intrinsic periods of the two block copolymer materials 26, 36 can be matched, for example, through a ternary blend of either or both of the copolymer materials with one or more homopolymers to adjust the polymer periods ($L_o$ values). See, for example, R. Ruiz, R. L. Sandstrom and C. T. Black, "Induced Orientational Order in Symmetric Diblock Copolymer Thin-Films," *Advanced Materials*, 2007, 19(4), 587-59, the disclosure of which is incorporated by reference herein.

As illustrated in FIGS. 5A-5C, this initial anneal results in the formation of a single layer 38 of assembled and ordered, perpendicular-oriented lamellar domains 40, 42 that are registered to the underlying assembled domains of the base film 28 within the trenches 16, i.e., the lamellar domains 30, 32 (FIG. 5B) or the half-cylinders 30' and matrix domains 32' (FIG. 5C) of the base film within the trenches. The annealed copolymer layer 38 comprises alternating stripes of the two components of the lamellar-phase block copolymer. Only those portions of the copolymer film 36 that are heated above the glass transition temperature of the component polymer blocks will self-assemble, and areas of the film situated outside of region "A" that were not sufficiently heated remain as the initially deposited disordered and unassembled block copolymer film 36. A temperature gradient can be provided across the substrate, with the temperature above the glass transition temperature in regions where annealing of the film occurs to produce registered and ordered structures, and below the glass transition temperature in areas outside of those regions.

Figure 6A:
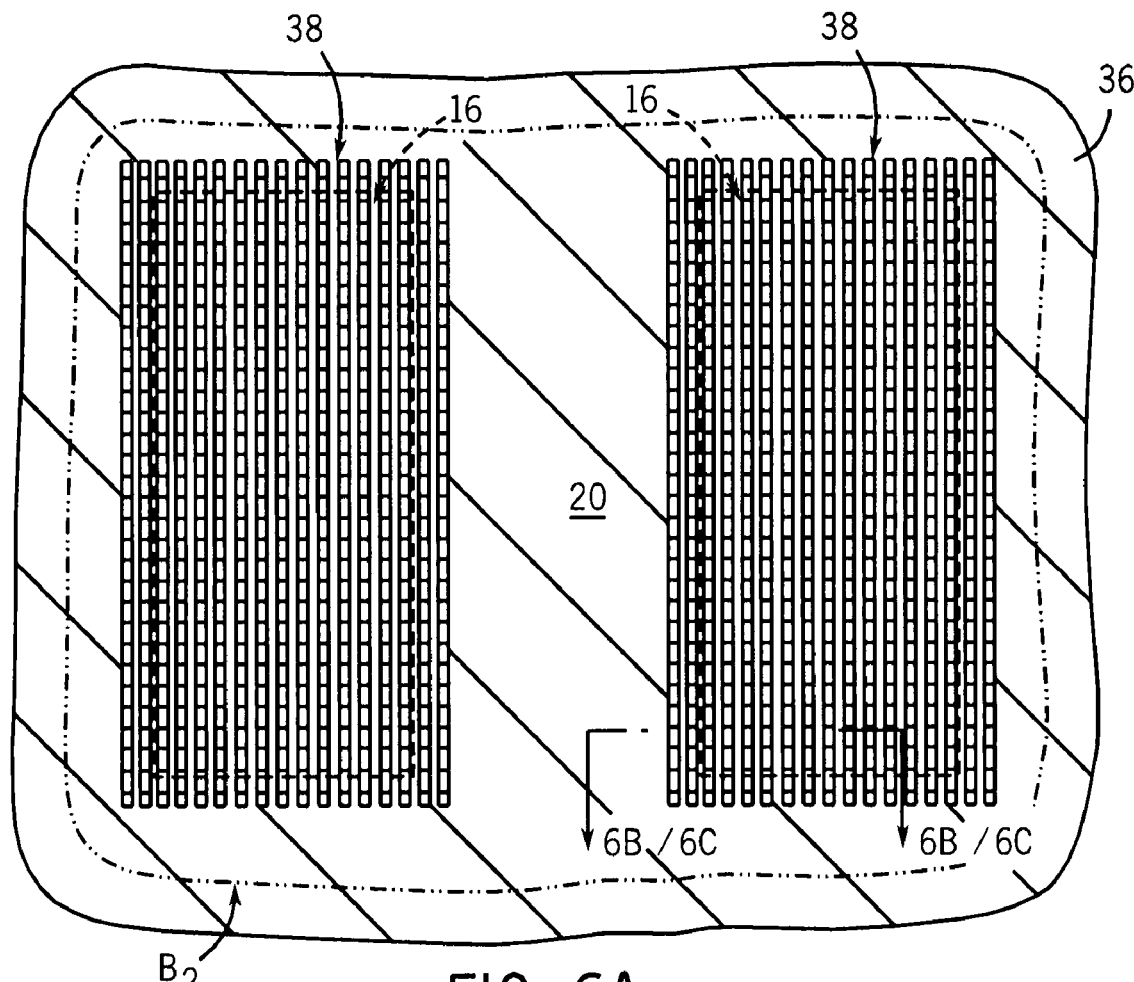
Figure 6B:
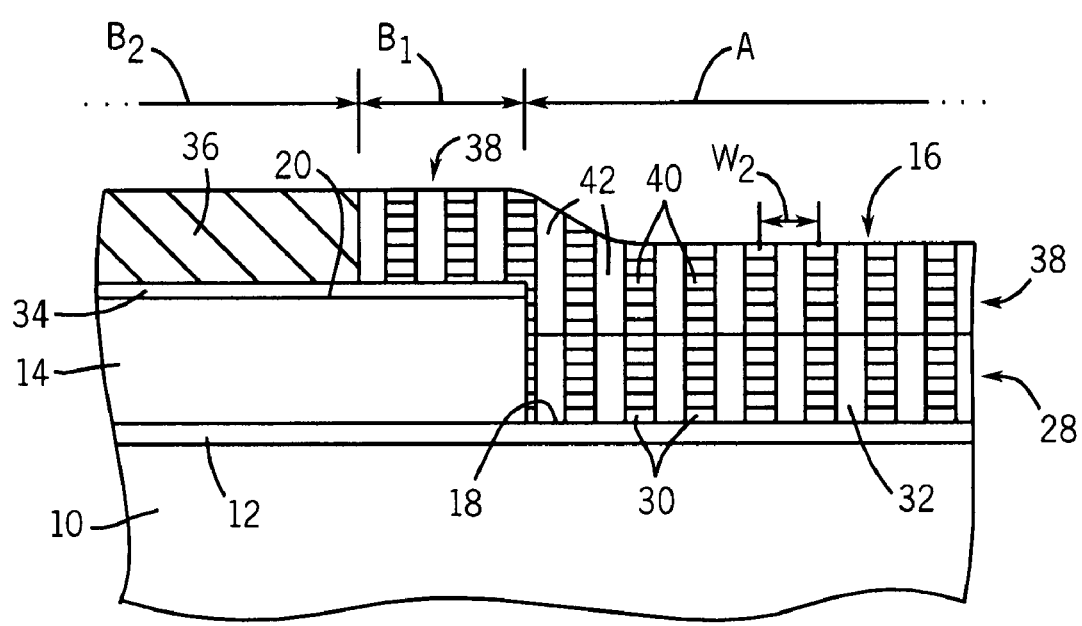
Figure 6C:
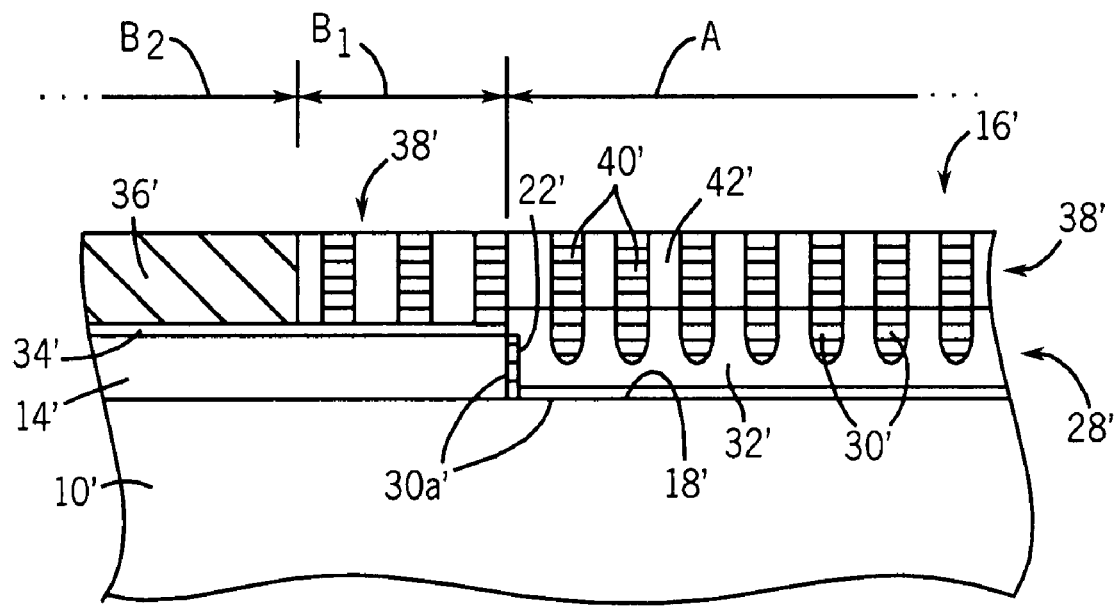

Following the annealing and ordering of the copolymer film 38 within region "A", the zone of thermal heating ("thermal corona") is expanded laterally, using the initially formed self-assembled lamellar structure 38 over the trenches 16 to induce an ordering effect on the adjacently situated unannealed portion of the polymer film 36 beyond the edges of the trenches (region "$B_1$"). In some embodiments, the localized heating of the lamellar-forming film 36 is performed to limit heating to about 3-4 to 6-8 pitches or repeat units, $L_o$, of the copolymer film 30 at a time, e.g., to dashed line "$B_1$" in FIGS. 5A-5C. The newly annealed portion of the film (i.e., region "$B_1$") will then self-assemble into perpendicular-oriented lamellar domains in an ordered repeat pattern that matches and is registered to the previously formed adjacent array within region "A", as shown in FIGS. 6A-6C. Once the ordering of lamellae within the annealed zone has been completed, the zone of heating can be further expanded laterally (region "$B_2$") to anneal additional portions of the second block copolymer film adjacent to the previously annealed and ordered portion of the film (i.e., region "$B_1$") to extend the range of ordered structures over the substrate until the desired pattern repeat structure is obtained.

Figure 7A:
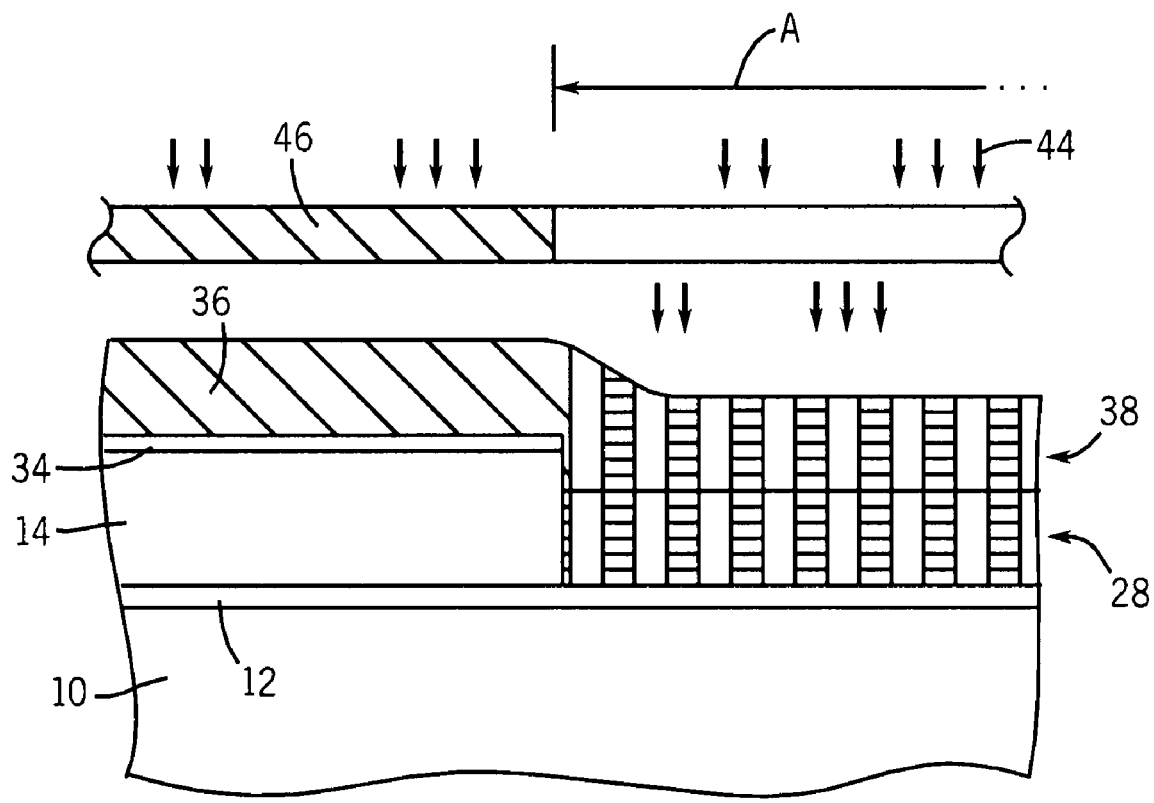
FIGS. 7A-7B illustrate elevational, cross-sectional views of the substrate depicted in FIG. 5B, showing annealing of a portion of the film at various stages according to an embodiment of the disclosure by use of a laser source illuminated through a mask or reticle.
Figure 7B:
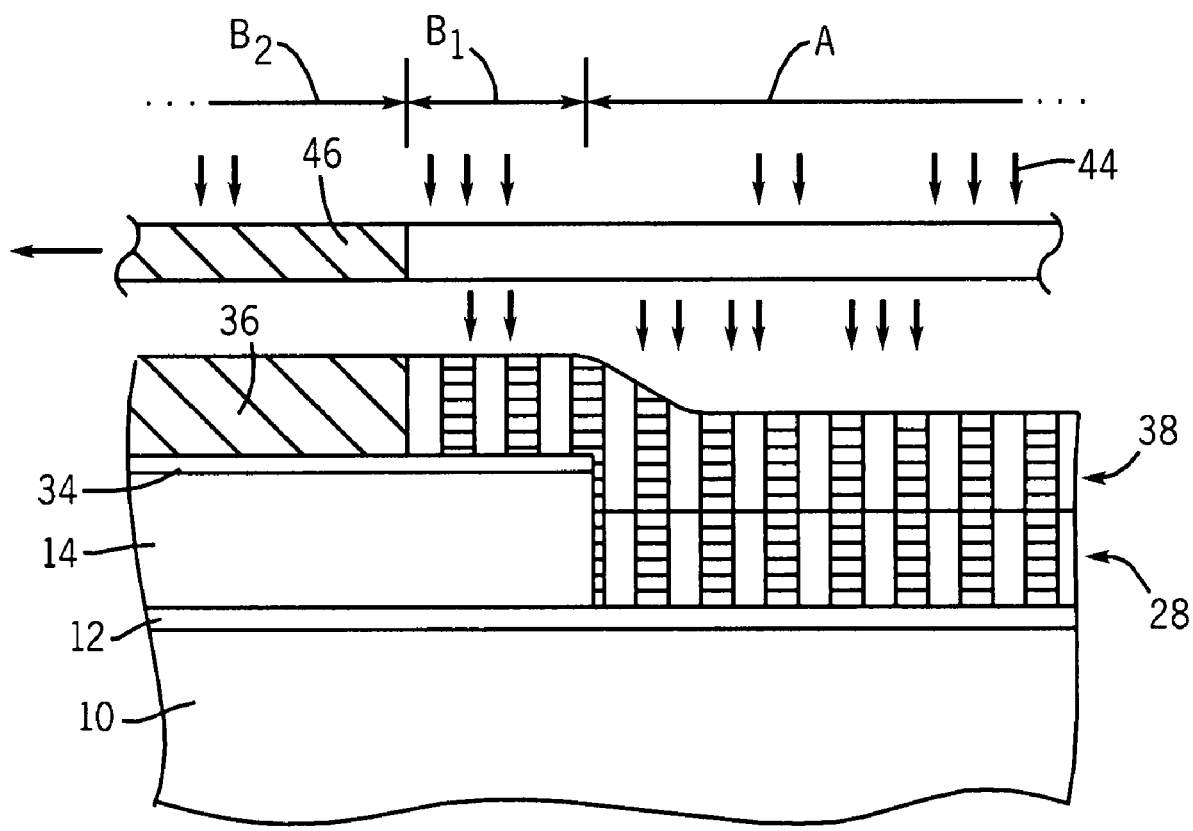

In one embodiment, depicted in FIG. 7A, annealing of the lamellar-phase block copolymer layer 36 is accomplished by focused and localized thermal heating of a targeted area (e.g., region "A") by directing a laser source 44 of short-UV wavelength onto the film. The laser source 44 (with adequate power) can be illuminated through a mask (or reticle) 46 or masking elements associated with a laser beam apparatus that shades all areas except for the trenches or inner portions of the trenches (FIG. 7A). Where the rate of microphase domain segregation is on the order of heat transfer through the film 36, the sections of the film situated above the ordered cylindrical film within the trenches will self-assemble first and in registry with the pattern of the underlying base film 28. The continued addition of thermal energy radiating laterally from the initially assembled, registered portion of the film 36 (within region "A") can be applied to result in regular, registered self assembly across the breadth of the lamellar-phase film 36 (regions "$B_1$" as in FIG. 5A). The laser beam 44 can also be expanded (e.g., defocused) to widen the area of coverage of the film 36, or step-scanned or sweep-scanned across the substrate (arrow ← in FIG. 7B), with the scanning rate set appropriately. The laser source is applied at appropriate parameters (e.g., wavelength, pulse length, intensity) to anneal the targeted area of the film 36. The anneal can be provided using a pulsed laser source.

Figure 8A:
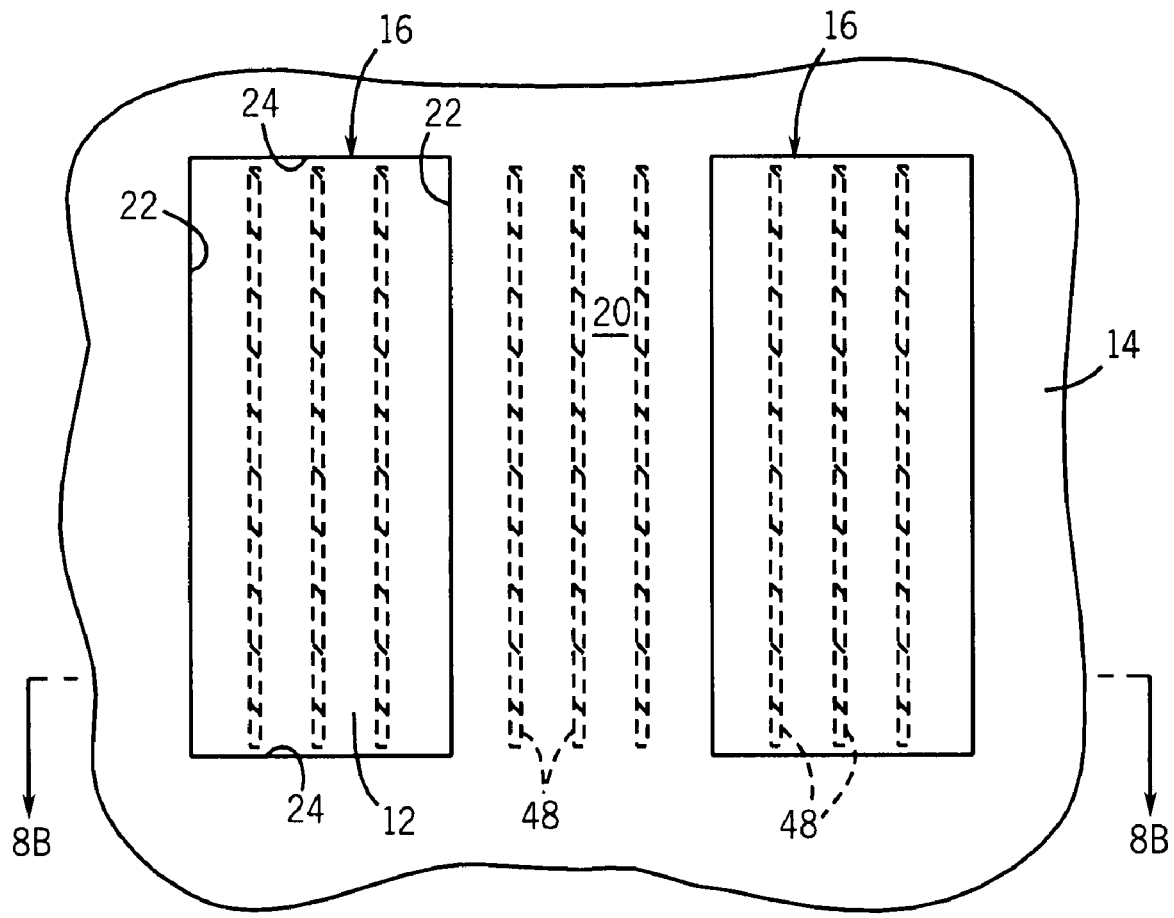
FIG. 8A illustrates a diagrammatic top plan view of the substrate of FIG. 1A, showing the incorporation of thermally conductive lines in the substrate for localized heating of the film layer according to an embodiment of the disclosure.
Figure 8B:
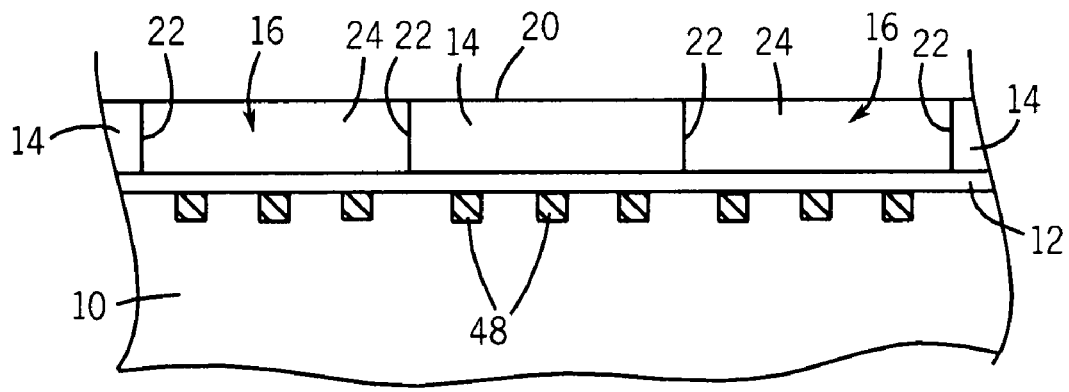
FIG. 8B illustrates an elevational, cross-sectional view of the substrate depicted in FIG. 8A taken along lines 8B-8B.

In another embodiment, illustrated in FIGS. 8A-8B, a series of thin lines 48 of a thermally conductive material (e.g., metal) can be formed in or on the substrate 10 prior to forming the material layer 14. As shown, the conductive lines 48 are provided to extend beneath the trenches 16, and optionally to extend under the material layer 14 beyond the trenches. Heat can be generated through the conductive lines 48 to initially anneal the film 36 above the trenches (within region "A"), and then to radiate laterally to anneal areas of the film adjacent to the self-assembled film 38 above the trenches (region "$B_1$").

Figure 9:
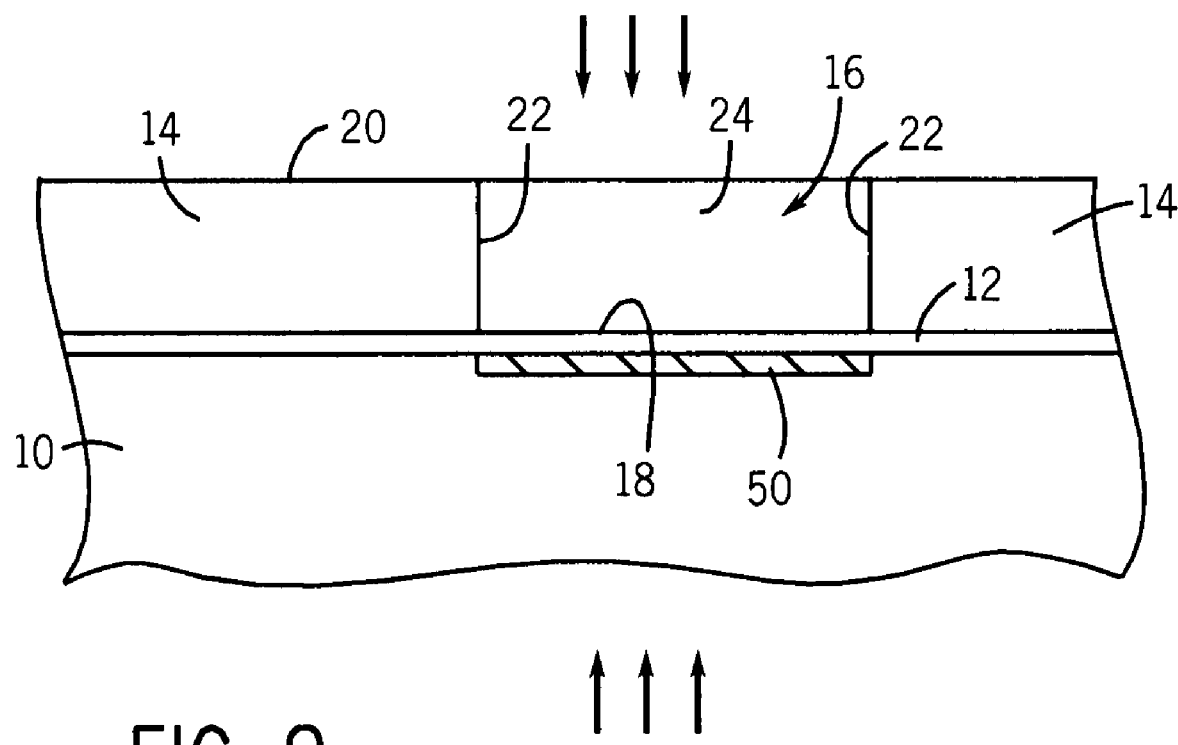
FIG. 9 illustrates an elevational, cross-sectional view of the substrate of FIG. 1A, showing the incorporation of an absorptive material layer for localized heating of the film layer according to another embodiment of the disclosure.
Figure 10A:
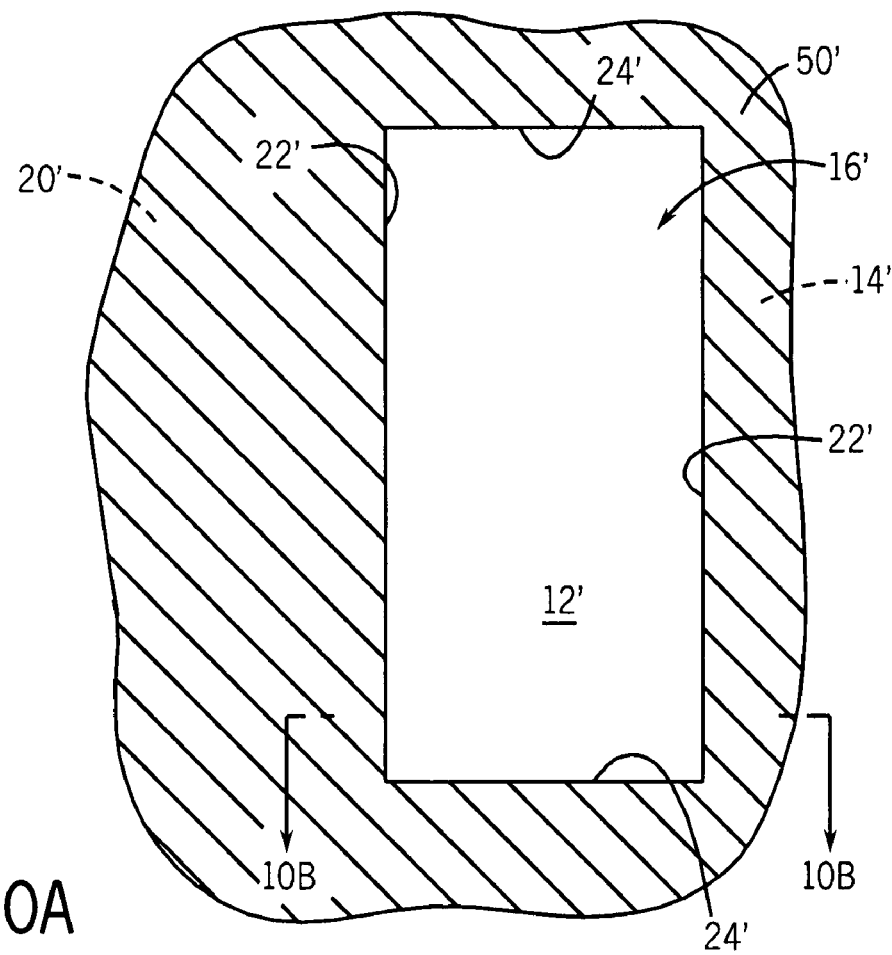
FIG. 10A illustrates a diagrammatic top plan view of the substrate of FIG. 1A, showing the incorporation of a reflective material layer on the exposed surfaces outside of the trenches for localized heating of the film layer according to another embodiment of the disclosure.
Figure 10B:
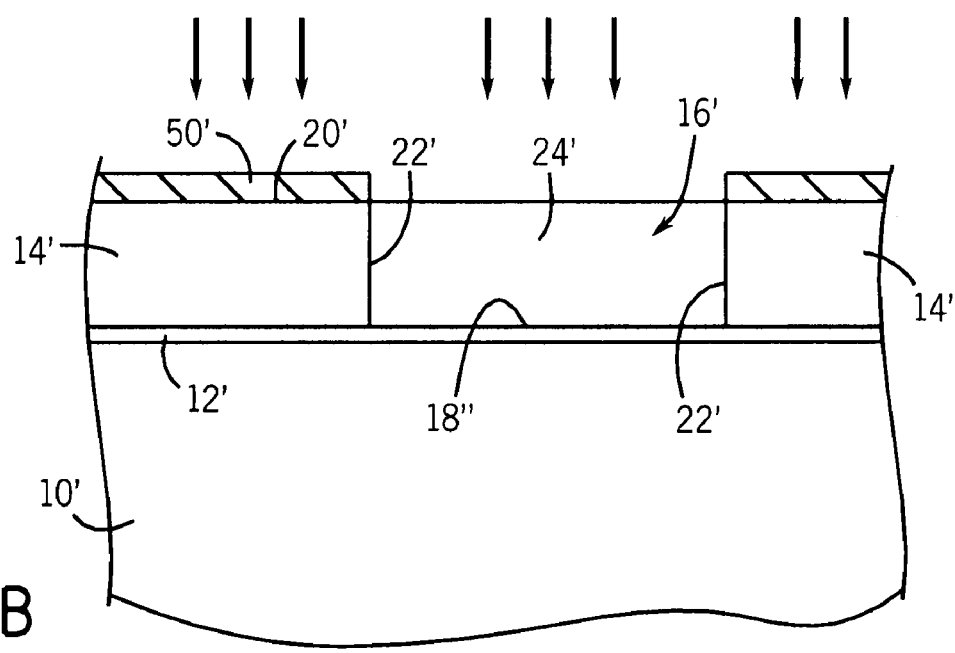
FIG. 10B is an elevational, cross-sectional view of the substrate depicted in FIG. 10A taken along lines 10B-10B.

In yet another embodiment, selective localized heating of the lamellar-phase film 36 can be provided by selectively applying an absorptive material layer 50 to substrate 10 prior to depositing the neutral wetting layer 12 and the material layer 14, as shown in the embodiment depicted in FIG. 9, or a reflective material layer 50' to the surface of the material layer 14' outside of the trenches (e.g., the crests 20') as depicted in FIGS. 10A-10B. Upon application of a radiative heat source (e.g., infrared (ir) heat source or quartz lamp) (arrows ↓), there will be a difference in absorption and/or reflectivity between the area having the reflective or absorptive material layer thereon and those areas that do not, such that localized areas of the film 36 will be heated to above the glass transition temperature while surrounding material will be below that temperature. As lamellae form, the power of the light source can then be slowly increased to expand the area having a temperature above the glass transition temperature, allowing the ordered formation of lamellae along the advancing hot zone. Examples of suitable materials for layer 50 (FIG. 9) include absorptive materials such as silicon carbide and organic infrared (IR) or near-infrared (NIR) absorbers such as Lumogen® fluorescent dyes (e.g., Lumogen IR 765® and Lumogen IR 788®) (BASF), among others. In other embodiments, the neutral wetting layer 12 can be modified or tailored with absorptive functionality. Examples of suitable materials for layer 50' (FIGS. 10A-10B) include reflective metals such as aluminum (Al), tungsten (W), chromium (Cr), copper (Cu), ruthenium (Ru), nickel (Ni), among others.

In some embodiments, as shown in FIG. 9, the backside of the substrate (e.g., wafer) can be heated (arrows ↑) to produce differences in emissivity between the trench bottom (floor) 18 and the surrounding areas to yield a desired temperature gradient. A coating 50 of a low emissivity material (e.g., a metal such as aluminum, tungsten, etc.) can be applied to the trench floors 18 which will radiate less heat and maintain a higher temperature than the surrounding area.

In another embodiment, the film 36 can be annealed in a moving temperature gradient (zone annealed). For example, as illustrated in FIG. 11A, the film 36 can be moved across a hot-cold temperature gradient 52a positioned above the film or beneath the substrate 10 (as shown) at a translational set speed (e.g., about 0.05-10 μm/second) using a motorized translation stage 54 whereupon ordering of nanostructures occurs at the backside as the film re-cools after passing under or over the heat source. In another embodiment shown in FIG. 11B, a heat source can be positioned above the film 36 (e.g., 52b) and/or or beneath the substrate 10 (e.g., 52b') and moved across the film using a motorized mechanism.

Figure 12A:
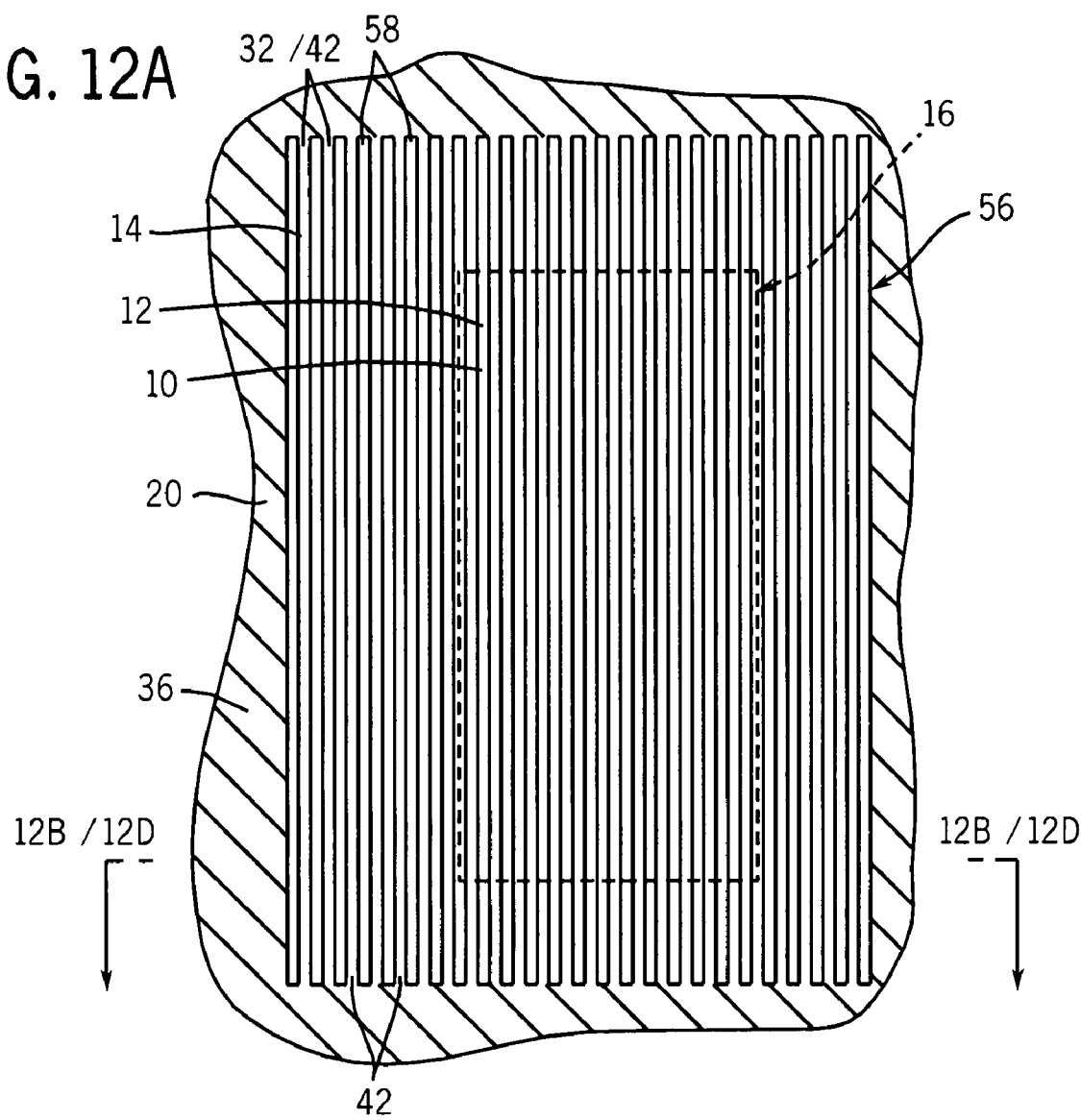
FIG. 12A illustrates a diagrammatic top plan view of a portion of the substrate of FIG. 6A at a subsequent stage.
Figure 12B:
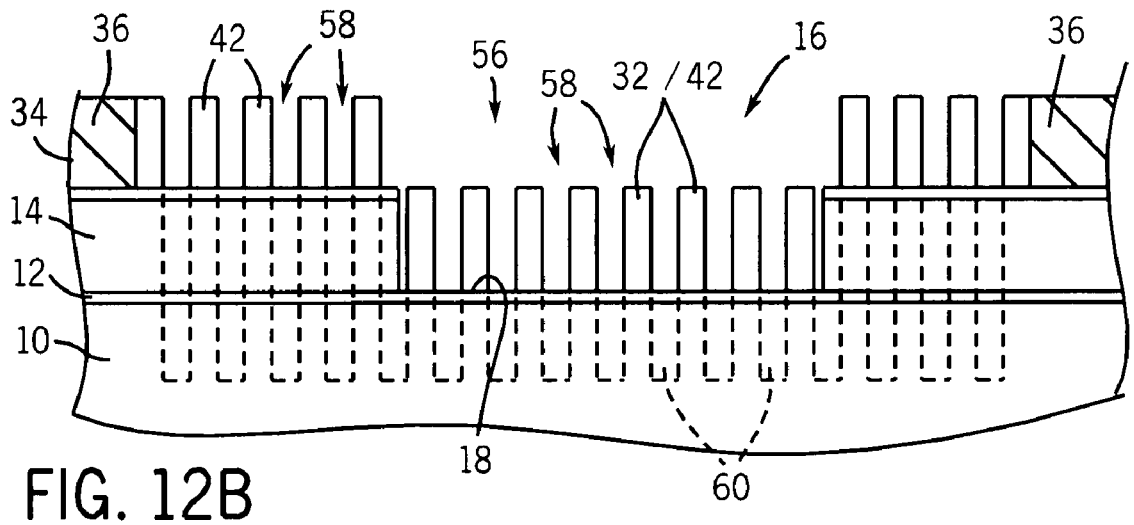
FIGS. 12B and 12D illustrate elevational, cross-sectional views of the substrate depicted in FIG. 12A taken along lines 12B/12D-12B/12D.
Figure 12C:
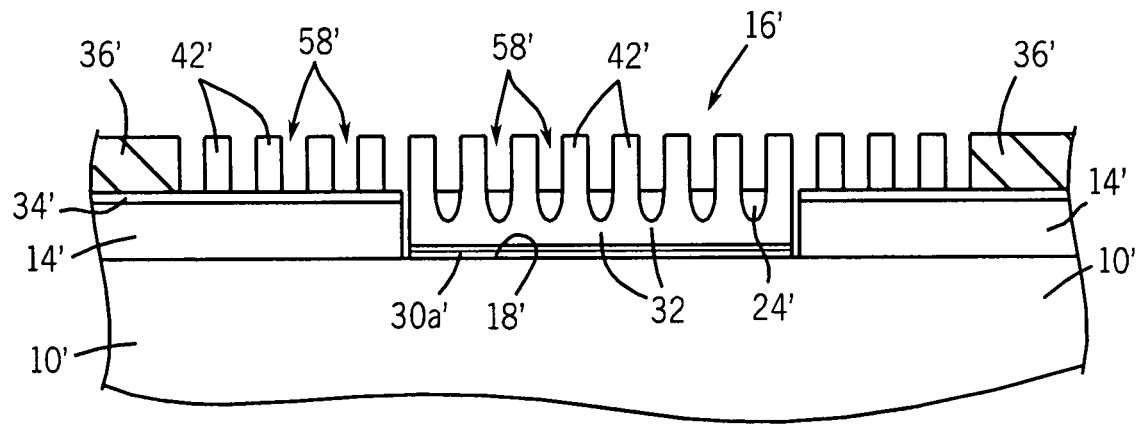
FIG. 12C illustrates an intermediate structure showing the removal of half-cylindrical domains in a step prior to FIG. 12D.

Referring now to FIGS. 12A-12C, after annealing and the lamellar-phase block copolymer material 36 is ordered to form film 38, one of the block components can be selectively removed to produce a thin film 56 that can be used, for example, as a lithographic template or mask to pattern the underlying substrate 10 (and material layer 14 on the crests 20) in a semiconductor processing to define regular patterns in the nanometer size range (i.e., about 10-100 nm). Within the trenches 16, selective removal of both a lamellar domain (e.g., 40) and the underlying polymer domain of the base film (e.g., 30) is performed.

For example, as illustrated in FIG. 12B, selective removal of the PMMA domains 30, 40 will result in openings (slits) 58 separated by vertically oriented PS lamellar domains 32/42 with the trench floor 18 (e.g., neutral wetting layer 12 or substrate 10) exposed where the PMMA was removed. Removal of the PMMA phase domains 30, 40 can be performed, for example, by application of an oxygen ($O_2$) plasma, or by a chemical dissolution process such as acetic acid sonication by first irradiating the sample (ultraviolet (UV) radiation, 1 J/cm^2 254 nm light), then ultrasonicating the film in glacial acetic acid, ultrasonicating in deionized water, and rinsing the film in deionized water to remove the degraded PMMA.

Figure 12D:
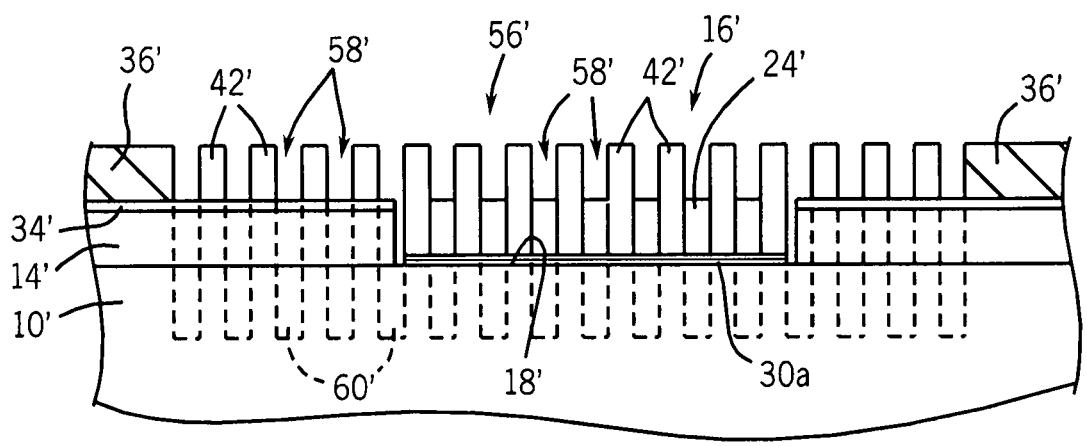

Referring to FIG. 12C, in the use of a cylindrical-phase base film (26' in FIG. 6C), the PS matrix 32' situated underneath the half-cylinders 30' and over the trench floors 18' remains after the removal of the PMMA domains, and is removed, for example, by plasma $O_2$ etch, prior to a patterning process to expose the underlying substrate 10 as illustrated in FIG. 12D.

In another embodiment, the selective removal of PS phase domains 32, 42 will result in openings (slits) separated by PMMA lamellar domains 30, 40.

In some embodiments, the resulting films have a corrugated surface that defines a linear pattern of fine, nanometer-scale, parallel slits (openings) 58 about 5-50 nm wide and several microns in length (e.g., about 10-4000 μm), the individual slits separated by a polymer matrix 42 about 5-50 nm wide. For example, removal of the PMMA domains affords a PS mask of sublithographic dimensions, for example, a pitch of about 35 nm (17.5 nm PS domain). A smaller pitch can be dialed in by using lower molecular weight diblock copolymers.

The films can be used, for example, as a lithographic template or etch mask to pattern (arrows ↓↓) the underlying substrate 10 (and layer 14), for example, by a non-selective RIE etching process, to delineate a series of channels or grooves 60, shown in phantom in FIG. 12B. In some embodiments, the channels can then be filled with a conductive material (e.g., metal) to form nanowire channel arrays for transistor channels, semiconductor capacitors, and other structures, or with a dielectric material to separate active areas. Further processing can then be performed as desired.

The films provide linear arrays having long range ordering and registration for a wide field of coverage for templating a substrate. The films are useful as etch masks for producing close pitched nanoscale channel and grooves that are several microns in length, for producing features such as floating gates for NAND flash with nanoscale dimensions. By comparison, photolithography techniques are unable to produce channels much below 60 nm wide without high expense. Resolution can exceed other techniques such as conventional photolithography, while fabrication costs utilizing methods of the disclosure are far less than electron beam (E-beam) or EUV photolithographies which have comparable resolution.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method for fabricating nanoscale microstructures, comprising:
   forming a first film comprising a self-assembling block copolymer within a trench in a substrate, the trench having sidewalls, a width and a length;
   forming a base layer by annealing the first film to form self-assembled polymer domains spanning the width and extending the length of the trench in a substantially parallel orientation to the sidewalls;
   forming a second film comprising a self-assembling lamellar-phase block copolymer over the annealed base layer and the substrate; and
   annealing a portion of the second film overlying the base layer within the trench such that self-assembled lamellar domains are formed only within said portion of the second film with said lamellar domains registered to corresponding polymer domains of the annealed base layer.

2. The method of claim 1, further comprising applying heat to an unannealed portion of the second film adjacent to the annealed portion such that self-assembled lamellar domains are formed within said portion registered to the annealed second film.

3. The method of claim 1, wherein applying heat to the second film comprises directing a laser source of short-UV wavelength onto the film.

4. The method of claim 1, wherein the substrate comprises a series of conductive elements extending the length of the trench, and applying heat to the second film comprises conducting heat through the conductive elements.

5. The method of claim 1, wherein the substrate comprises a series of conductive elements extending the length of the trench and lateral to the trench, and applying heat to anneal the portion of the second film overlying the base layer within the trench comprises conducting heat through the conductive elements.

6. The method of claim 5, further comprising conducting heat through the conductive elements lateral to the trench to selectively heat said unannealed portion of the second film.

7. The method of claim 1, wherein an absorptive or reflective material layer is situated solely over the floor of the trench, and applying heat comprises globally applying a heat source such that the absorptive or reflective material layer is heated to a temperature effective to selectively anneal said portion of the second film overlying the base layer within the trench.

8. The method of claim 7, wherein heat is applied to a backside of the substrate.

9. The method of claim 1, further comprising, prior to forming the second copolymer film, crosslinking the first film.

10. The method of claim 1, further comprising, forming a mask by selectively removing the first polymer block to provide an array of slits separated by the second polymer block.

11. The method of claim 10, further comprising etching the substrate through the slits in the mask.

12. The method of claim 1, wherein at least one of the block copolymer materials comprises a blend of the block copolymer with a homopolymer of the first polymer block, the second polymer block, or both.

13. The method of claim 1, wherein the block copolymer materials comprise polystyrene and polymethyl methacrylate.

14. A method for fabricating nanoscale microstructures, comprising:
   forming a first film comprising a self-assembling block copolymer within a trench in a substrate, the block copolymer comprising first and second polymer blocks, and the trench having sidewalls, a width and a length;
   forming a base layer by annealing the first film to form a single array of self-assembled polymer domains spanning the width and extending the length of the trench in a substantially parallel orientation to the sidewalls;
   forming a second film comprising a self-assembling lamellar-phase block copolymer over the annealed base layer and the substrate, the block copolymer comprising first and second polymer blocks; and
   annealing a portion of the second film overlying the base layer within the trench such that alternating lamellar domains of the first polymer block and the second polymer block are formed only within said portion of the second film with said lamellar domains registered to the corresponding domains of the annealed base layer.

15. The method of claim 14, further comprising applying heat to an unannealed portion of the second film adjacent to the annealed portion such that the second film assembles into a single array of perpendicularly oriented, alternating lamellar domains of the first and second polymer blocks registered to the annealed second film.

16. A method for fabricating nanoscale microstructures, comprising:
   forming a first film comprising a self-assembling lamellar-phase block copolymer within a trench in a substrate to a thickness of about $L_o$, the block copolymer comprising first and second polymer blocks, and the trench having a width of about $nL_o$, a depth of greater than or at about $L_o$, a length, preferential wetting sidewalls and a neutral wetting floor;
   forming a base layer by annealing the first film to form a single array of n self-assembled, perpendicular-oriented lamellar polymer domains spanning the width and extending the length of the trench in a substantially parallel orientation to the sidewalls, wherein a pitch distance between each domain is about $L_o$;
   forming a second film comprising a self-assembling lamellar-phase block copolymer over the annealed base layer and the substrate to a thickness of about $L_o$, the block copolymer comprising first and second polymer blocks; and applying heat to anneal a portion of the second film overlying the base layer within the trench such that a single array of perpendicularly oriented, alternating lamellar domains of the first polymer block and the second polymer block are formed only within said portion of the second film with said lamellar domains registered to the corresponding domains of the annealed base layer.

17. The method of claim 16, wherein the block copolymer comprises an about 50:50 to 60:40 ratio of the first polymer block to the second polymer block.

18. The method of claim 16, further comprising, prior to depositing the first block copolymer film, selectively grafting a neutral wetting polymer to the floor of the trench such that the floor is neutral wetting.

19. A method for fabricating nanoscale microstructures, comprising:
  forming a first film comprising a self-assembling cylindrical-phase block copolymer within a trench in a substrate to a thickness of about $L_o$, the block copolymer comprising first and second polymer blocks, and the trench having a width of about $nL_o$, a depth of less than $L_o$, a length, and preferential wetting sidewalls and floor;
  forming a base layer by annealing the first film to form a single array of n self-assembled, surface-exposed half-cylinder domains of the first polymer block in a matrix of the second polymer block, the half-cylinder domains spanning the width and extending the length of the trench in a substantially parallel orientation to the sidewalls and floor of the trench, wherein a pitch distance between each half-cylinder domain is about $L_o$;
  forming a second film comprising a self-assembling lamellar-phase block copolymer over the annealed base layer and the substrate to a thickness of about $L_o$, the block copolymer comprising first and second polymer blocks; and
  applying heat to anneal a portion of the second film overlying the base layer within the trench such that a single array of perpendicularly oriented, alternating lamellar domains of the first polymer block and the second polymer block are formed only within said portion of the second film with said lamellar domains registered to the corresponding polymer domains of the annealed base layer.

20. The method of claim 19, wherein the cylindrical-phase block copolymer comprises an about 60:40 to 80:20 ratio of the first polymer block to the second polymer block.

21. A method for fabricating nanoscale microstructures, comprising:
  forming a plurality of conductive lines on a substrate;
  forming a material layer over the substrate;
  forming a trench in the material layer, the trench having a width of about $nL_o$, a depth, a length, sidewalls, and a floor, and at least one of said conducting lines situated within and extending the length of the trench;
  forming a first film comprising a self-assembling block copolymer within the trench to a thickness of about $L_o$, the block copolymer comprising first and second polymer blocks;
  forming a base layer by annealing the first film to form a single array of n self-assembled polymer domains spanning the width and extending the length of the trench in a substantially parallel orientation to the sidewalls, wherein a pitch distance between each domain is about $L_o$;
  forming a second film comprising a self-assembling lamellar-phase block copolymer over the annealed base layer and the material layer to a thickness of about $L_o$, the block copolymer comprising first and second polymer blocks; and
  conducting heat through the conductive lines within the trench to selectively heat a first portion of the second film overlying the base layer within the trench such that a single array of perpendicularly oriented lamellar domains of the first polymer block and the second polymer block self-assemble only within said heated portion of the second film with said lamellar domains registered to the corresponding domains of the annealed base layer.

22. The method of claim 21, further comprising conducting heat through the conductive elements situated lateral to the trench to selectively heat a second portion of the second film adjacent to the self-assembled first portion.

23. A method for fabricating nanoscale microstructures, comprising:
  forming a layer of a reflective or absorptive material on a substrate;
  forming a material layer over said reflective or absorptive material layer;
  forming a trench in the material layer, the trench having a width of about $nL_o$, a depth, a length and sidewalls;
  forming a first film comprising a self-assembling block copolymer within the trench to a thickness of about $L_o$, the block copolymer comprising first and second polymer blocks;
  forming a base layer by annealing the first film to form a single array of n self-assembled polymer domains spanning the width and extending the length of the trench in a substantially parallel orientation to the sidewalls, wherein a pitch distance between each domain is about $L_o$;
  forming a second film comprising a self-assembling lamellar-phase block copolymer over the annealed base layer and the material layer to a thickness of about $L_o$, the block copolymer comprising first and second polymer blocks; and
  selectively heating a first portion of the second film overlying the base layer within the trench such that a single array of perpendicularly oriented lamellar domains of the first polymer block and the second polymer block self-assemble only within said heated portion of the second film with said lamellar domains registered to the corresponding domains of the annealed base layer.

24. The method of claim 23, further comprising applying heat to an expanded area of the film to heat a second portion of the second film adjacent to the self-assembled first portion.

25. The method of claim 23, wherein heating the film comprises exposing the film to radiation.

26. The method of claim 23, wherein heating the film comprises applying heat to a backside of the substrate.

27. A method for fabricating nanoscale microstructures, comprising:
  forming a material layer over said reflective or absorptive material layer;
  forming a trench in the material layer, the trench having a width of about $nL_o$, a depth, a length, and sidewalls;
  forming a first film comprising a self-assembling block copolymer within the trench to a thickness of about $L_o$, the block copolymer comprising first and second polymer blocks;
  forming a base layer by annealing the first film to form a single array of n self-assembled polymer domains spanning the width and extending the length of the trench in a substantially parallel orientation to the sidewalls, wherein a pitch distance between each domain is about $L_o$;
  forming a second film comprising a self-assembling lamellar-phase block copolymer over the annealed base layer and the material layer to a thickness of about $L_o$, the block copolymer comprising first and second polymer blocks; and applying a laser source through a masking element to selectively heat a first portion of the second film overlying the base layer within the trench such that a single array of perpendicularly oriented lamellar domains of the first polymer block and the second polymer block self-assemble only within said heated portion of the second film with said lamellar domains registered to the corresponding domains of the annealed base layer.

28. The method of claim 27, further comprising applying the laser source to an expanded area of the film to heat a second portion of the second film adjacent to the self-assembled first portion.

29. A method of forming nanoscale microstructures, comprising:

forming a first film of a block copolymer having a thickness of about $L_o$ within a trench in a substrate, the trench having a width of about $nL_o$, a depth, a length, and sidewalls, and the first block copolymer comprises an about 50:50 to 80:20 ratio of a first polymer block to a second polymer block, the block copolymer capable of microphase separating upon annealing;

causing a microphase separation in the first film to produce a base layer comprising a single array of n self-assembled polymer domains spanning the width and extending the length of the trench in a substantially parallel orientation to the sidewalls, wherein a pitch distance between each domain is about $L_o$;

forming a second film of a lamellar-phase block copolymer over the base layer and exposed surfaces of the substrate outside the trench to form a second film having a thickness of about $L_o$ and comprising first and second polymer blocks;

causing a microphase separation selectively in a first portion of the second film overlying the base layer within the trench to produce a single array of self-assembled and perpendicularly oriented, alternating lamellar domains of the first polymer block and the second polymer block registered to the corresponding domains of the base layer; and causing a microphase separation selectively in a second portion of the second film adjacent to the self-assembled first portion such that said second portion self-assembles into a single array of perpendicular-oriented, alternating lamellar domains of the first and second polymer blocks registered to the self-assembled first portion of the second film.

30. A method for fabricating nanoscale microstructures, comprising:

forming a first film comprising a self-assembling lamellar-phase block copolymer within a trench in a substrate to a thickness of about $L_o$, the block copolymer comprising first and second polymer blocks, and the trench having a width of about $nL_o$, a depth of greater than or about $L_o$, a length, preferential wetting sidewalls and a neutral wetting floor;

forming a base layer by annealing the first film to form a single array of n perpendicular-oriented lamellar domains of alternating blocks of the first polymer block and the second polymer block spanning the width and extending the length of the trench, wherein a pitch distance between each domain is about $L_o$;

forming a second film comprising a self-assembling lamellar-phase block copolymer over the annealed first film and substrate to a thickness of about $L_o$, the block copolymer comprising first and second polymer blocks; and selectively applying heat to anneal a portion of the second film overlying the base layer within the trenches such that a single array of perpendicular-oriented, alternating lamellar domains of the first and the second polymer blocks are formed only within said portion of the second film with the lamellar domains of the second film registered to the base layer.

31. The method of claim 30, further comprising applying heat to an unannealed portion of the second film adjacent to the annealed portion such that the second film assembles into a single array of perpendicularly-oriented, alternating lamellar domains of the first and second polymer blocks registered to the annealed portion of the second film.

32. The method of claim 31, further comprising removing the lamellar domains of the second film and underlying half-cylinder domains of the base layer comprised of the first polymer block to form openings.

33. The method of claim 31, further comprising removing a portion of the second polymer block within said openings to expose the trench floor.

34. A method for fabricating nanoscale microstructures, comprising:

forming a first film comprising a self-assembling cylindrical-phase block copolymer within a trench in a substrate to a thickness of about $L_o$, the block copolymer comprising first and second polymer blocks, and the trench having a width of about $nL_o$, a depth of less than $L_o$, a length, and preferential wetting sidewalls and a floor;

forming a base layer by annealing the first film to form a single array of n parallel-oriented, half-cylinder domains of the first polymer block in a matrix of the second polymer block, said half-cylinder domains spanning the width and extending the length of the trenches substantially parallel with the sidewalls and floor of the trench, wherein a pitch distance between each half-cylinder domain is about $L_o$;

forming a second film comprising a self-assembling lamellar-phase block copolymer over the base layer and the material layer to a thickness of about $L_o$, the lamellar-phase block copolymer comprising first and second polymer blocks; and applying heat to anneal a portion of the second film overlying the base layer within the trench such that a single array of perpendicular-oriented, alternating lamellar domains of the first and the second polymer blocks are formed only within said portion of the second film with the lamellar domains of the second film registered to the half-cylinder and matrix domains of the base layer.

35. The method of claim 34, further comprising applying heat to an unannealed portion of the second film adjacent to the annealed portion such that the second film assembles into a single array of perpendicularly-oriented, alternating lamellar domains of the first and second polymer blocks registered to the annealed portion of the second film.

36. The method of claim 35, further comprising removing the lamellar domains of the second film and underlying half-cylinder domains of the base layer comprised of the first polymer block to form openings.

37. The method of claim 35, further comprising removing a portion of the second polymer block within said openings to expose the trench floor.

* * * * *